United States Patent [19]
Conrad et al.

[11] Patent Number: 5,963,329
[45] Date of Patent: Oct. 5, 1999

[54] METHOD AND APPARATUS FOR MEASURING THE PROFILE OF SMALL REPEATING LINES

[75] Inventors: Edward W. Conrad, Jeffersonville; David P. Paul, Essex Junction, both of Vt.

[73] Assignee: International Business Machines Corporation, Armonk, N.Y.

[21] Appl. No.: 08/961,929

[22] Filed: Oct. 31, 1997

[51] Int. Cl.$^6$ .......................... G01B 11/00; G01B 11/24; G01B 11/02
[52] U.S. Cl. .......................... 356/372; 356/376; 356/384
[58] Field of Search .................... 356/372, 376, 356/384, 239.3, 239.7, 239.8, 237.2, 237.5

[56] References Cited

U.S. PATENT DOCUMENTS

| | | |
|---|---|---|
| 4,141,780 | 2/1979 | Kleinknecht et al. . |
| 4,408,884 | 10/1983 | Kleinknecht et al. . |
| 4,593,368 | 6/1986 | Fridge et al. . |
| 4,707,610 | 11/1987 | Lindow et al. . |
| 4,748,335 | 5/1988 | Lindow et al. . |
| 5,042,949 | 8/1991 | Greenberg et al. . |
| 5,164,790 | 11/1992 | McNeil et al. . |
| 5,349,440 | 9/1994 | DeGroot . |
| 5,363,171 | 11/1994 | Mack . |

FOREIGN PATENT DOCUMENTS

| | | |
|---|---|---|
| 0601580 | 6/1994 | European Pat. Off. . |
| 0225038 | 12/1984 | Japan . |
| 1747877 | 7/1992 | U.S.S.R. . |

OTHER PUBLICATIONS

Diffraction Analysis of Dielectric Surface–relief Gratings, M. G. Moharam and T. K. Gaylord, vol. 72, No. 10/Oct. 1982/J. Opt. Soc. Am. pp. 1385–1392.

Formulation for Stable and Efficient Implementation of the Rigorous Coupled–wave analysis of Binary Gratings, M. G. Moharam, Eric B. Grann, and Drew A. Pommet, vol. 12, No. 5/May 1995/J. Opt. Soc. Am. pp. 1069–1076.

(List continued on next page.)

*Primary Examiner*—Robert H. Kim
*Assistant Examiner*—Amanda Merlino
*Attorney, Agent, or Firm*—James M. Leas

[57] ABSTRACT

A method for nondestructively determining the line profile or topographical cross-section of repeating lines on a substrate is provided, including line thickness, line width, and the shape of the line edge. A substrate having a repeating structure, such as a grating, is illuminated with broad-band radiation. Diffracted radiation is collected, measured, and recorded as a function of wavelength to provide an intensity versus wavelength curve. An initial model of the line profile of the grating, a model of the broad band radiation shined on the grating, and a model of the interaction of the radiation with the model grating is provided to a data processing machine. The machine uses Maxwell's equations to calculate a model diffracted intensity versus wavelength curve, and the measured intensity curve is then compared with this modeled intensity versus wavelength curve. The line profile in the model is then adjusted and the model intensity curve recalculated to improve agreement between the measured and calculated intensity curves. The model is repeatedly adjusted and the intensity recalculated until the best agreement between the two intensity versus wavelength curves is achieved, thereby providing the line profile. The method similarly provides composition profiles, such as doping depth profiles and optical coating profiles by taking advantage of the relationship between index of refraction and composition.

28 Claims, 15 Drawing Sheets

OTHER PUBLICATIONS

Linewidth Measurement of Gratings on Photomasks: A Simple Technique, S. Sohail H. Haqvi, Susan Gaspar, Kirt Hickman, Ken Biship, and John R. McNeil, Apr. 1, 1992/ vol. 32, No. 10/Applied Optics pp. 1377–1384.

Stable Implementation of the rigorous Coupled–wave Analysis for Surface–Relief Gratings: Enhanced Transmittance Matrix Approach, M. G. Moharam, Drew A. Pommett, and Eric B. Grann vol. 12, No. 5/May 1995/J. Opt. Soc. Am.A, pp. 1077–1085.

Use of Light Scattering in Characterizing Reactively Ion Etched Profiles, Konstantinos P. Giapis, Richard A. Gottscho, Linda A. Clark, Joseph B. Kruskall, and Diane Lambert, AT&T Bell Laboratories, Murray Hill, NJ 07974 and Avi Kornblit and Dino Sinatore, AT&T Bell Laboratories, Allentown PA 18103, page No. and date not available.

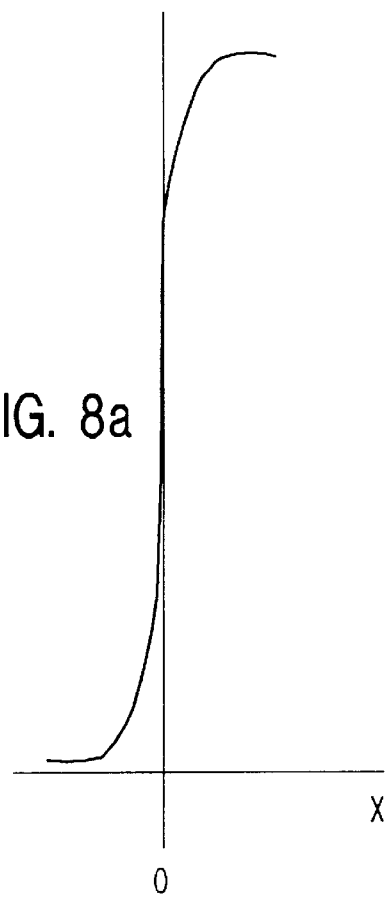
FIG. 8a
FIG. 8b
FIG. 8c
FIG. 8d
TOP SEED
BOTTOM SEED

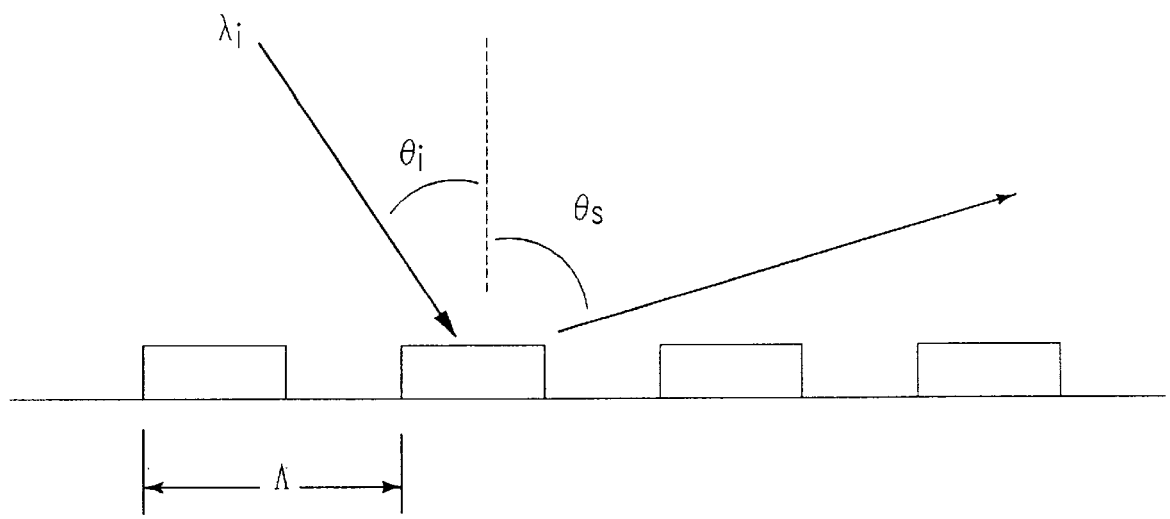
FIG. 10
FIG. 13a
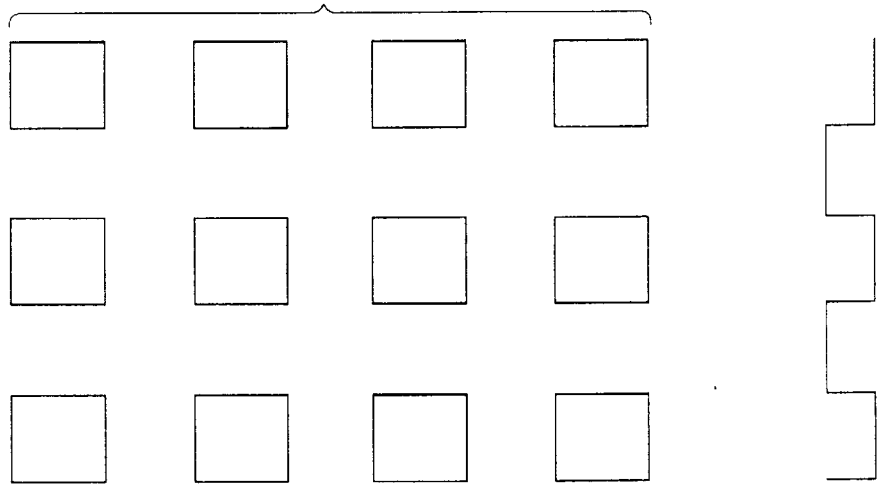
FIG. 13c
FIG. 13b

```
[0]   COUPLEDWAVE WL;TT;DD
[1]   ⍝ Set ORDERS = the number of +diffracted orders retained.
[2]   WAVELENGTH←WL
[3]   f←LAYER[;2]÷GRATINGPERIOD              ⍝ Determine f from dimensions
[4]   d←LAYER[;3]                            ⍝ Layer thicknesses
[5]   no←1                                   ⍝ Index of air
[6]   THETA←TH                               ⍝ Angle of incidence, degrees
[7]   THET←THETA×o1÷180                      ⍝ Incidence angle, radians
[8]   ns←SIINDEX WAVELENGTH                  ⍝ Determine the substrate index
[9]   n←oρo
[10]  FILMINDEX¨LAYER[;1]                    ⍝ Determine the FILM index
[11]  M←1+ORDERS×2                           ⍝ N will always be odd
[12]  h←(⍳N)-1                               ⍝ h is 0 1 2 3 4 5 6 7...
[13]  i←h-((N-1)÷2)                          ⍝ i is ...⁻3 ⁻2 ⁻1 0 1 2 3....
[14]  I←,DD←(N,N)ρ0
[15]  TT←(N,N)ριN
[16]  IL((0=,(TT-⌽TT))/⍳N*2]←1
[17]  I←(ρf)ρ⊂(ρDD)ρI                        ⍝ I is the identity matrix
[18]  IL←1⊃I
[19]  k0←o2÷WAVELENGTH
[20]  kxi←k0×(no×1oTHET)-i×WAVELENGTH÷GRATINGPERIOD
[21]  k1zi←((-(TT<0)×2)+1)×(TT+((k0*2)×(no*2))-(kxi*2))*.5
[22]  k2zi←(((k0*2)×(ns*2))-(kxi*2))*.5      ⍝ Absorbing substrate (Si)
[23]  TM:
[24]  B←((K+.×¨(EE←⌽¨E←PERMITTIVITY))+.×¨K←WAVENUMBER}-:I
[25]  ⍝DERTM←0                                ⍝ TM eigenspace calculations
[26]  ⍝←TE
[27]  EIGENSTUFF E+.×¨B                      ⍝ PRODUCT MATRIX FOR TM (EE IS ⌽¨E)
[28]  V←(EE+.×¨W)+.×¨G                       ⍝ a SCALAR OR VECTOR WITH LENGTH OF f
[29]  X←I×¨-k0×¨Q×d                          ⍝ a FOR TM
[30]  DELTA←((2×N)×(,1)ρ(i=0),((2oTHET)×0J1÷no)×i=0
[31]  Z1←(1⊃I)×(N,N)ρk1zi÷((no*2)×k0)
[32]  Z2←(1⊃I)×(N,N)ρk2zi÷((ns*2)×k0)
[33]  M1←IL,[1.5]⍉0J1×Z1
[34]  FG←(1⊃I),[1.5]⍉0J1×Z2
[35]  FANDG: ϕιof
[36]  R←N↑,(-DELTA)⌷B(M1,-FG)                ⍝ Diffraction efficiency for TM
[37]  DERTM←(THETAOUT=TH)/(DERTM←(DERTM≠0)/DERTM←(R×+R)×9o(k1zi÷k0×no×2oTHET)
[38]  ⍝ DERTM←(DERTM=0)/DERTM←(R×+R)×9o(k1zi÷k0×no×2oTHET)
[39]  ⍝
[40]  DERTE←0
[41]  →COMB
[42]  TE:
```

FIG. 11a

```
[44]  A←(K+.×"K)-"E
[45]  EIGENSTUFF A                    ⍝ TE eigenspace calculations
[46]  V←W+.×Z                         ⍝ PRODUCT MATRIX FOR TE
[47]  X←I×"*-k0×"Q×d                  ⍝ a SCALAR OR VECTOR WITH LENGTH OF f
[48]  DELTA←((2×N),1)⍴(i=0),((2⊖THET)×0J1×n0)×i=0         ⍝ FOR TE
[49]  Y1←(1⊃I)×(N,N)⍴k1zi÷k0
[50]  Y2←(1⊃I)×(N,N)⍴k2zi÷k0
[51]  M1←IL,[1]-0J1×Y1
[52]  Y2←(1⊃I),[1]0J1×Y2
[53]  FANDG ϕ1⍴f
[54]  R←N+,(-DELTA)⌹(M1,-FG)
[55]              Diffraction efficiency for TE
[56]  DERTE←(THETAOUT=TH)/(DERTE=0)/DERTE+(R×+R)×9○(k1zi÷k0×n0×2⊖THET)
[57] ⍝ COMB:
[58]  CURVE←CURVE,[1]1 3⍴WAVELENGTH,DERTE,DERTM
[59] ⍝ CURVE←CURVE,[1]1 3⍴WAVELENGTH,DERTM,DERTE

[0]   EIGENSTUFF EI
[1]   Z←EIGEN"EI                      ⍝ The function EIGEN is an IBM program product
[2]   W←((⍴f)⍴⊂1 0)+..Z               ⍝ and cannot be shown here.
[3]   QQ←((⍴f)⍴⊂((-N),○))+..Z
[4]   Q←○⍴○
[5]   EIGENVALUE"QQ
[6]   Q←Q×"I

[0]   EIGENVALUE QQ
[1]   Q←Q,⊂(N,N)⍴QQ*.5

[0]   FANDG L;XA;XL;WL;VL
[1]   XL←L⊃X
[2]   WL←L⊃W
[3]   VL←L⊃V
[4]   AB←(⊟((-WL),[1]VL÷"FG)+.×(WL+.×XL),[1]VL+.×XL
[5]   A←(N,N)⍴AB
[6]   FG←(WL+.×IL÷XA),[1]WL+.×IL-XA÷XL+.×A

[0]   FILMINDEX FILM;C1;C2;C3;I
[1]   I←(2○=+/""(⊂FILM)=CAUCHY[;1]))/11↑⍴CAUCHY
[2]   C1←CAUCHY[I;2]
[3]   C2←CAUCHY[I;3]
[4]   C3←CAUCHY[I;4]
[5]   n←,C1+(C2÷(WAVELENGTH×10)*2)+C3÷(WAVELENGTH×10)*4
```

FIG. 11b

```
[0]    E←PERMITTIVITY
[1]    E←0ρ0
[2]    PERMPRIME¨ιρf

[0]    PERMPRIME M
[1]    PP←(N,N)ρh+1
[2]    II←⍟PP
[3]    EE←,(((n[M]*2)-(n0*2))×(1○(o1×(II-PP)×f[M]))÷o1×II-PP
[4]    EE[(0=,(II-PP))/ιN*2]←(((n[M]*2)×f[M])+(n0*2)×(1-f[M]))
[5]    E←E,⊂(ρII)ρEE

[0]    K←WAVENUMBER
[1]    K←(N,N)ρkxi÷k0
[2]    K←(⊂K)×¨I

[0]    ns←SIINDEX WAVELENGTH;INDEX;A;ks
[1]    ⍝ Determine the complex refractive index from 210 to 825 nm.
[2]    INDEX←¯1+2←(WAVELENGTH≤SI[;1])/ι1↑ρSI
[3]    ns←SI[INDEX[1];2]+(A←(WAVELENGTH-SI[INDEX[1];1])÷-/SI[INDEX[1];1])
×-/SI[INDEX;2]
[5]    ks←SI[INDEX[1];3]+A×-/SI[INDEX;3]
[6]    ns←ns-0J1×ks
```

FIG. 11c

METHOD AND APPARATUS FOR MEASURING THE PROFILE OF SMALL REPEATING LINES

FIELD OF THE INVENTION

This invention generally relates to a method of characterizing the size and shape of small periodic features on a substrate. More particularly, it relates to analyzing light reflected from a grating, or transmitted through the grating, to obtain line profile information.

BACKGROUND OF THE INVENTION

In microelectronics, accurate measurement of feature profiles (i.e. line width, line height, space between lines, and sidewall shape) are very important to optimizing device performance and chip yield. Measurements are needed at many steps in manufacturing to assure that critical dimensions, line profiles, and feature depths are under control. Historically, measurements have been accomplished with the following technologies:

Optical imaging using the resolving power of optical microscopes and image processing to measure small features. However, features smaller than the resolving power of the microscope can not be measured, nor can the line profile.

Electron-beam imaging, particularly the scanning electron microscope (SEM), greatly improves resolution over the optical microscope. However, like optical imaging, top-down SEM imaging does not provide profile information. While imaging a cross-sectioned samples does provide profile information, cross sectioning is destructive, costly, and labor intensive. In addition the signal processing used in SEM imaging introduces uncertainties. Furthermore, electron beams can damage the sample, and this is especially the case when sensitive materials such as photoresist are imaged. In addition, electron beam charging can seriously distort measurement signals, causing beam position deviations. To overcome this problem, conductive coatings are commonly used but coatings or their removal can damage the sample or effect measurement accuracy.

Scanning force microscopy (SFM) utilizes a very small mechanical probe to sense minute atomic forces that act very close to the surface of materials, and SFM can provide high resolution topographical information, including line profiles. Unfortunately, SFM is slow and operator-intensive, and the quantitative science of the probe tip is uncertain and unreliable.

Surface-contact mechanical-probe technologies, such as surface profilometers, have been used to profile large structures but do not offer the resolution or sensitivity required by today's characterization requirements. Furthermore, contact-probes distort surfaces. In addition, mechanical stability requirements prohibit the use of probes small enough to accommodate the submicrometer sizes commonly measured.

To measure the width of a line the location of each edge of its profile must be defined, and an arbitrary, qualitative edge detection model is usually used in each of the above measuring techniques. While this arbitrary measurement point is typically calibrated to a cross-section, manufacturing process changes and normal manufacturing process drift can invalidate the edge model and introduce significant measurement error.

Furthermore, none of the above techniques can characterize planarized, buried sub-micron structures that commonly are found in microelectronic or micro-machining manufacturing processes. Features may be formed that are later covered with a transparent (or semi-transparent) layer of material which is then planarized. If the feature sizes are below the resolution limits of optical techniques and the flat top surface prevents SEM and AFM imaging, none of the above well known techniques will work.

Two optical techniques are available for planarized buried structures. Scatterometry has been used for characterizing periodic topographic structures in which a light beam (typically a laser) illuminates an area to be characterized and the angular distribution of elastically scattered light is used to measure line widths on photomask and silicon wafer gratings. However, scatterometry requires a high degree of mechanical stability and accurate measurement of the laser beam impingement angle on the grating, and these mechanical limitations contribute to the uncertainty of scatterometry results.

Confocal laser imaging is another optical technique that permits characterization of planarized buried structures. Focus on the sample is progressively adjusted with a monochromatic, high numerical aperture (NA) optical imaging system, and those focus adjustments provide the line profile. The high NA lens has a very small depth of focus, and therefore, a physical profile can be obtained by moving through a series of focus settings up or down the features, and recording those height variations. However, the technique is limited by the resolution of the laser beam, or the size of the laser spot on the sample. Furthermore, the use of a high NA objective lens, providing a large angle to the incident beam limits the ability to characterize high aspect ratio features that are commonly found in semiconductor manufacturing.

Thus, a better solution for characterizing microstructure geometries is needed to determine the two dimensional physical profile of a line with a method that is rapid, accurate, reproducible, and reliable, and this solution is provided by the present invention.

SUMMARY OF THE INVENTION

It is therefore an object of the present invention to provide an optical method of determining a line profile of a sub-micron structure.

It is a feature of the present invention that the line profile is determined by comparing measured diffraction radiation intensity from a periodic structure on a substrate with modeled radiation intensity predicted from a theoretical line profile.

It is a feature of the present invention that line profile parameters of the model are varied until the predicted intensity converges to the measured intensity.

It is a feature of the present invention that a rigorous and detailed two dimensional analytical solution is obtained for the line profile.

It is an advantage of the present invention that the line profile is reliably, reproducibly, rapidly, and nondestructively, obtained.

These and other objects, features, and advantages of the invention are accomplished by a method of determining the profile of a line comprising the steps of:

(a) providing a substrate having a repeating structure comprising a plurality of lines, said lines having substantially identical profiles;

(b) illuminating said repeating structure with radiation wherein said radiation diffracts, said diffracted radiation having an intensity;

(c) measuring said intensity;

(d) providing a model structure on a data processing machine, said model structure comprising a repeating structure on said substrate, said model structure comprising a model profile;

(e) mathematically predicting a predicted diffracted radiation intensity when said model structure is illuminated with said radiation; and (f) comparing said predicted intensity with said measured intensity.

BRIEF DESCRIPTION OF THE FIGURES

The foregoing and other objects, features, and advantages of the invention will be apparent from the following detailed description of the invention and accompanying drawings, in which:

FIG. 8a is a seed line profile having an S shape corresponding to the data of Tables 1 and 2;

FIGS. 8b and 8c are top and bottom portions of the line profile of FIG. 8a;

FIG. 8d is the seed profile of FIG. 8a after scaling the data of Tables 1 and 2.

FIG. 10 illustrates diffracted angle from a grating as a function of incident angle and grating periodicity;

FIGS. 11a–11c are APL code for calculating the line profile of the present invention.

FIG. 13a is a top view of a two dimensional grating of trenches, such as DRAM capacitor trenches for which two dimensional line profiles can be calculated according to the present invention.

FIGS. 13b, 13c are orthogogal cross sections of the grating of FIG. 13a.

FIG. 14c shows the real and imaginary parts of the index of refraction versus depth profile calculated according to the present invention for the doping profile of FIG. 14a.

DETAILED DESCRIPTION OF THE INVENTION

The present invention is a method for nondestructively determining the topographical cross-section of lines on a substrate which provides line thickness, line width, and the shape of the line edge (the line profile). While a repeating structure, or grating, is required for the measurement, the method uses broad band illumination, does not involve contact with the substrate and can equally be used for buried planarized gratings. The method takes advantage of available parallel processing computer capabilities for providing rapid line profiles.

Diffraction gratings are often displayed with perfectly square, sine wave, sawtooth, triangular, or other ideal edges. But, in fact, the edges of all gratings deviate from the ideal, often significantly. There are important applications in semiconductor manufacturing where knowledge of the shape of the line edge, the line profile, is useful for monitoring or controlling a process. It is therefore one primary goal of this invention to provide an improved method of determining this line profile. In addition, there are other applications in semiconductor manufacturing where composition profile versus depth, such as doping concentration versus depth is needed, and the invention also satisfies this need.

Figure 1:
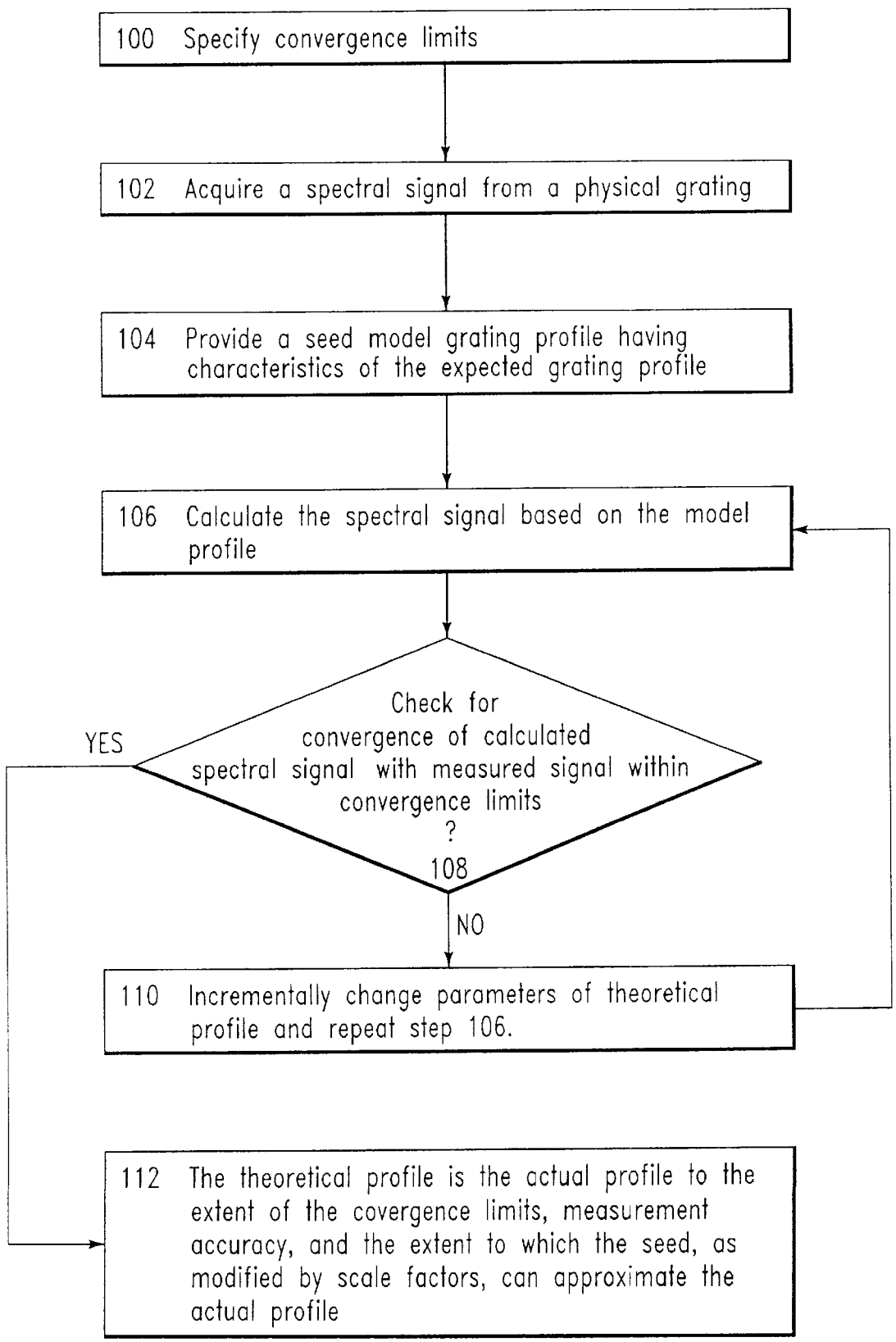
FIG. 1 is a flow chart of the steps of the present invention, showing the iterative process for calculating a line profile.

The flow chart of FIG. 1 illustrates the method of the present invention. In the first step (step 100), convergence criteria are established between measured and calculated curves acquired in steps described hereinbelow. Next a substrate having a repeating structure, such as a grating, is illuminated with broad band radiation. Diffracted radiation is collected, measured, normalized to the incident radiation, and recorded as a function of wavelength to provide an intensity versus wavelength curve (step 102). Then, an initial model (or seed model) of the line profile of the grating, a model of the broad band radiation shined on the grating, and a model of the interaction of the radiation shined with the model grating is provided to a data processing machine (step 104). The data processing machine uses Maxwell's equations to calculate a model diffracted intensity versus wavelength curve (step 106), and the measured intensity curve is then compared with this modeled intensity versus wavelength curve (step 108). If agreement between the curves within the convergence criteria of step 100 is not found, the line profile in the model is then adjusted (step 110) and the model intensity curve recalculated to attempt to improve agreement between the measured and calculated intensity curves (steps 106 and 108 repeated). The model is repeatedly adjusted and the intensity recalculated until agreement, within the convergence criteria established in step 100, between the two intensity versus wavelength curves is achieved. The theoretical profile is the actual profile to an accuracy determined by the extent of the prescribed convergence limits, measurement accuracy, and the extent to which the seed, as modified by scale factors, can approximate the actual profile (step 112).

The invention takes advantage of the fact that the magnitude of the energy diffracted into the various diffraction orders is strongly influenced by the line profile in addition to line width, line spacing, and thickness and optical properties of the materials comprising the grating. Because of the sensitivity of the diffraction pattern to these additional parameters, the present invention provides a means to extract one or more of these parameters in addition to the line profile.

The invention extracts a profile-dependent signal from a grating by measuring the intensity of diffracted radiation over a small solid angle. Thus, only a portion of the diffracted radiation is measured, such as the radiation in the zeroth order of the diffraction pattern. Because details of the line profile affects the distribution of energy among the diffraction orders, the line profile may be obtained by measuring the intensity in only one of the orders.

Figure 2:
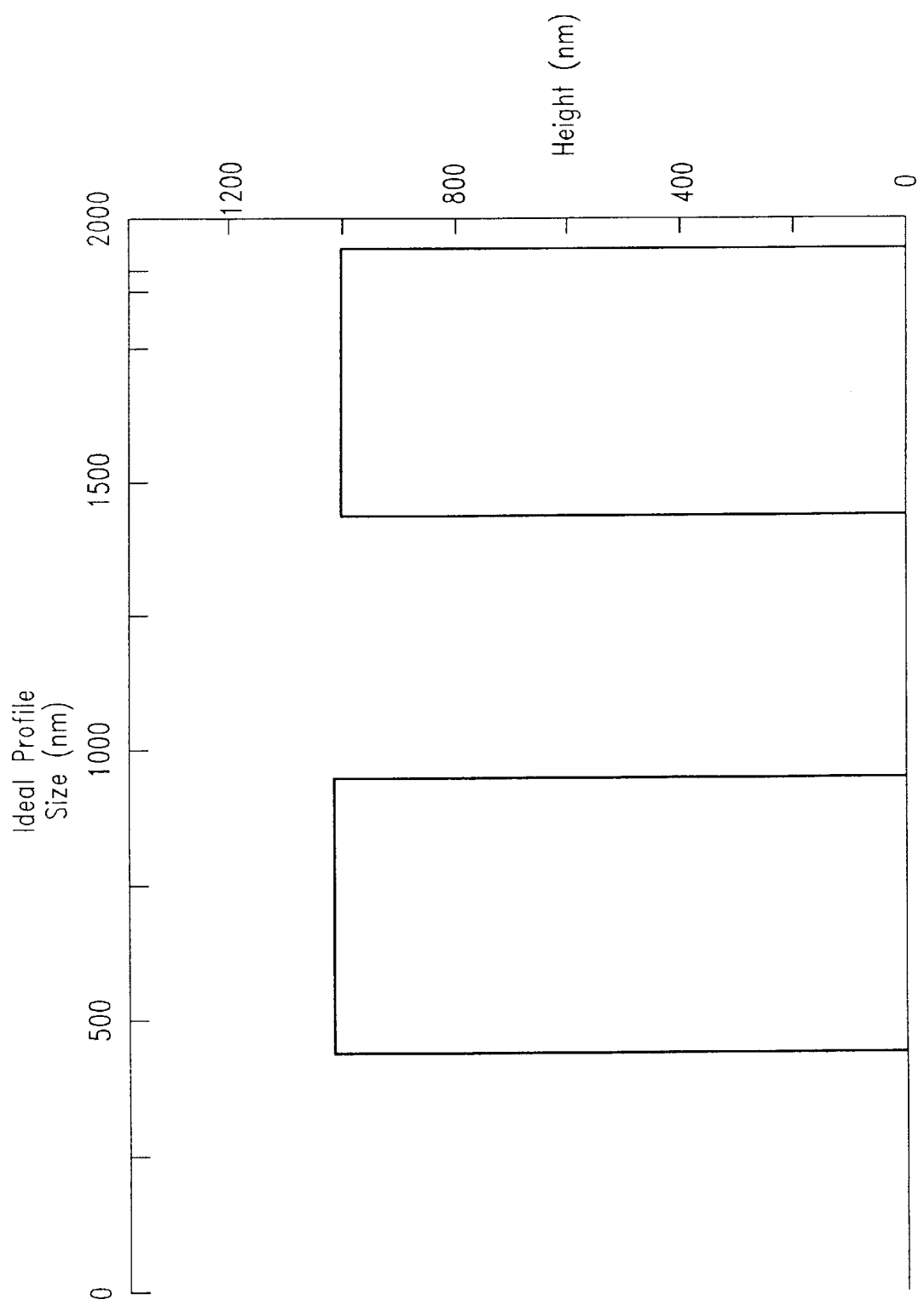
FIG. 2 is an ideal grating having a vertical line profile.
Figure 3:
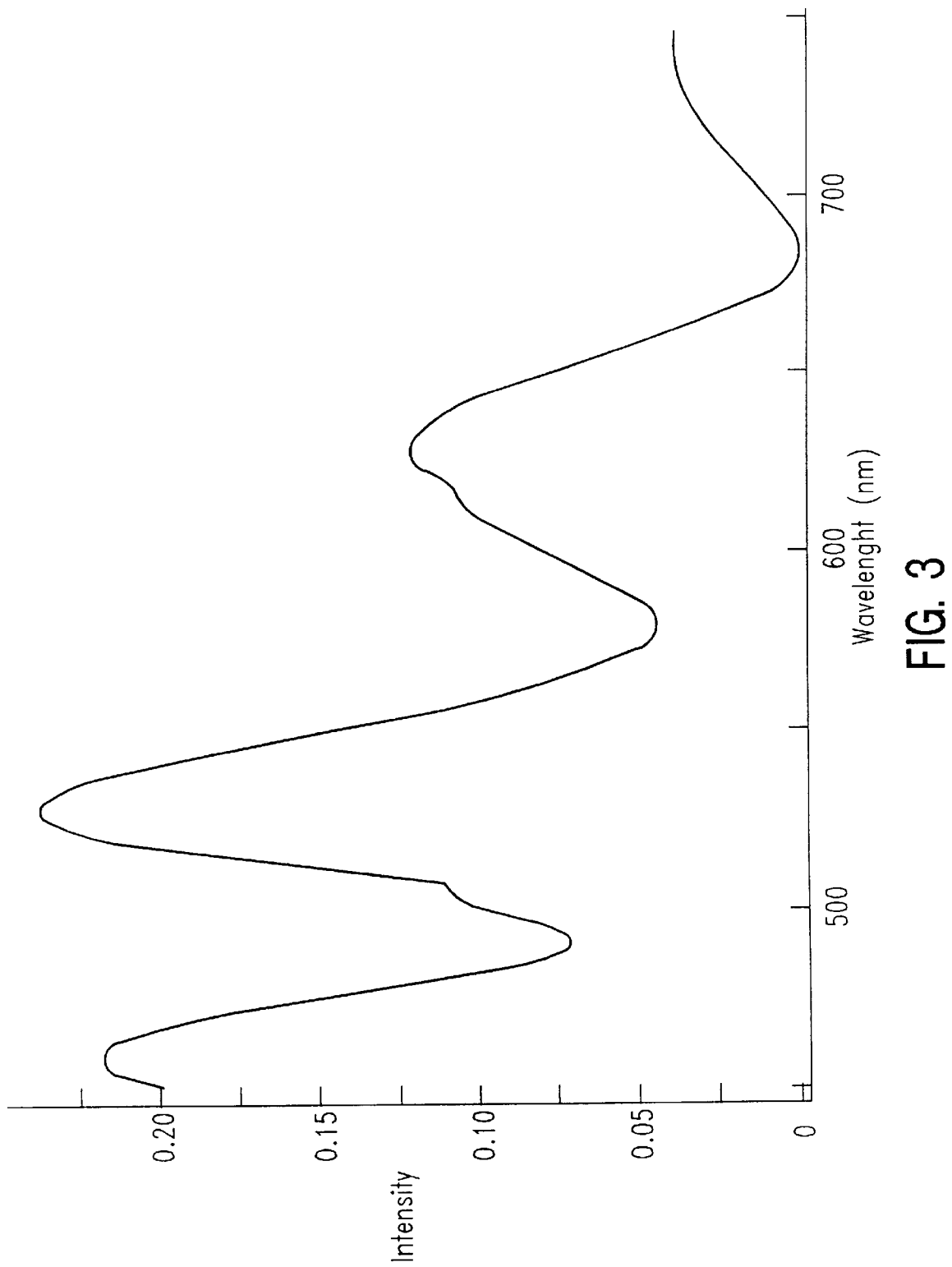
FIG. 3 is a an intensity versus wavelength curve for the ideal grating of FIG. 2.

FIG. 2 shows a diffraction grating with idealized vertical edges. The interaction of this grating with broad-band illumination (light having a range of colors) can be modeled using Maxwell's equations, and the reflected intensity as a function of wavelength for the zeroth order (the order near normal to the surface) can be calculated, as shown in FIG. 3. Preferably the grating has at least 5 lines.

Figure 4:
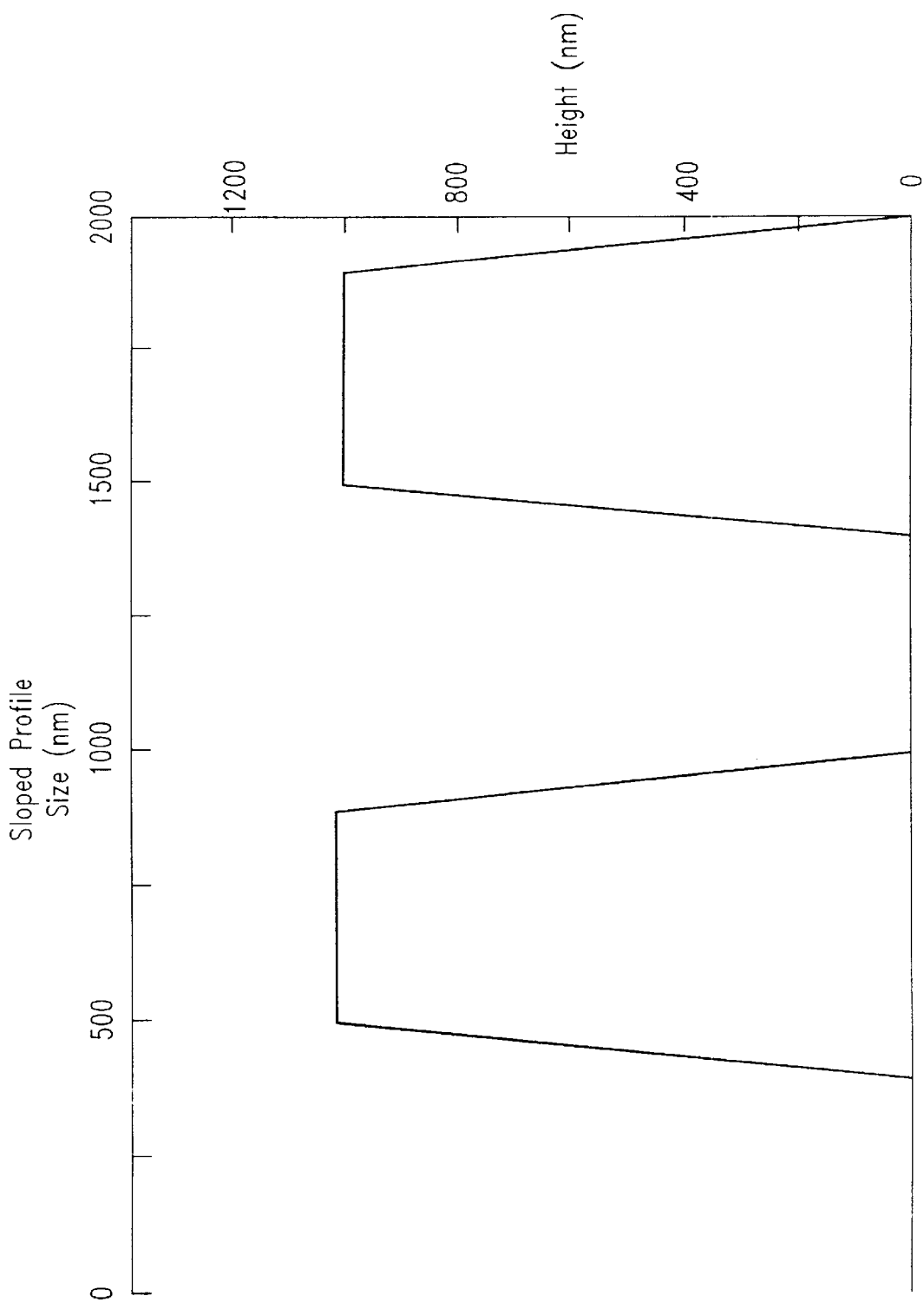
FIG. 4 is a an ideal grating having a sloped line profile.
Figure 5:
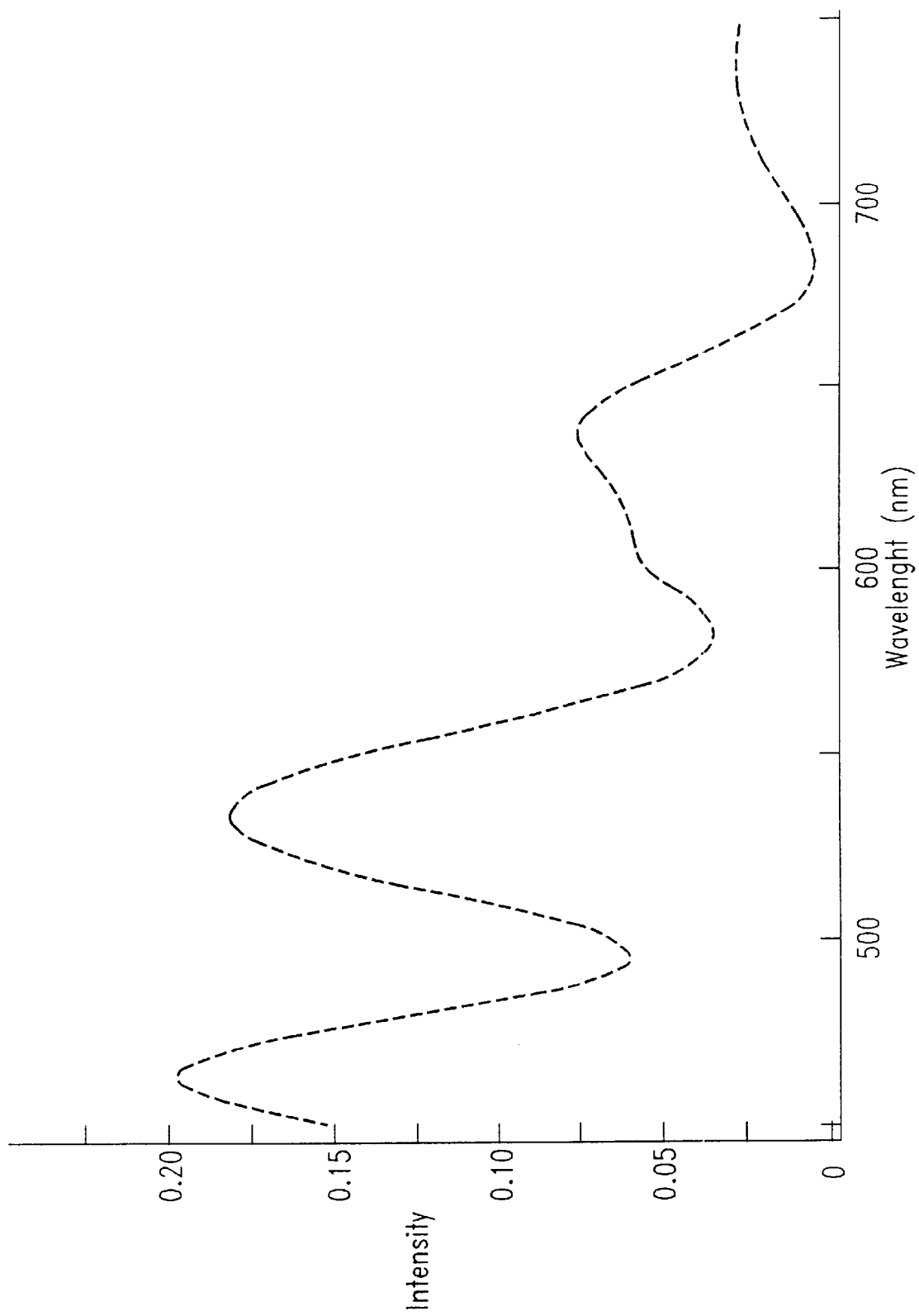
FIG. 5 is an intensity versus wavelength curve for the ideal grating of FIG. 4.
Figure 6:
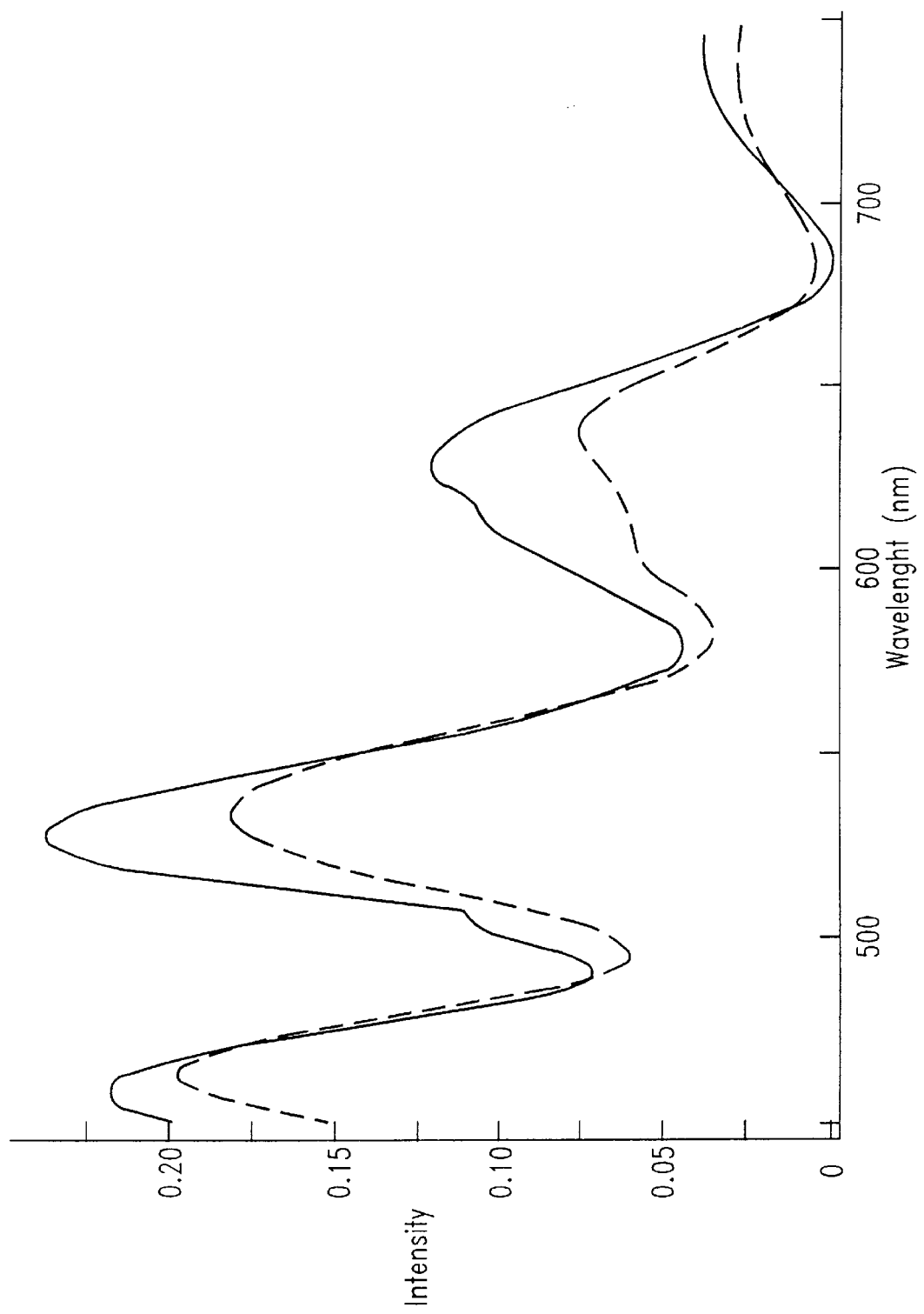
FIG. 6 is an overlay of the intensity versus wavelength curves shown in FIGS. 3 and 5 illustrating the effect of a change in grating profile on the intensity versus wavelength curve.

FIGS. 4–6 illustrate how changes in the line profile can change the energy so diffracted. In FIG. 4, a grating similar to that of FIG. 1 is used, but with line edges having a slope of about 85 degrees. The intensity versus wavelength curve predicted by Maxwell's equations for the grating of FIG. 4 is shown in FIG. 5. To further illustrate the difference in intensity versus wavelength curves due to the change in line profile, the curves of FIGS. 3 and 5 are superimposed in FIG. 6. The marked difference in intensity versus wavelength demonstrated in FIG. 6 is taken advantage of in this invention to determine line edge profiles.

Figure 7:
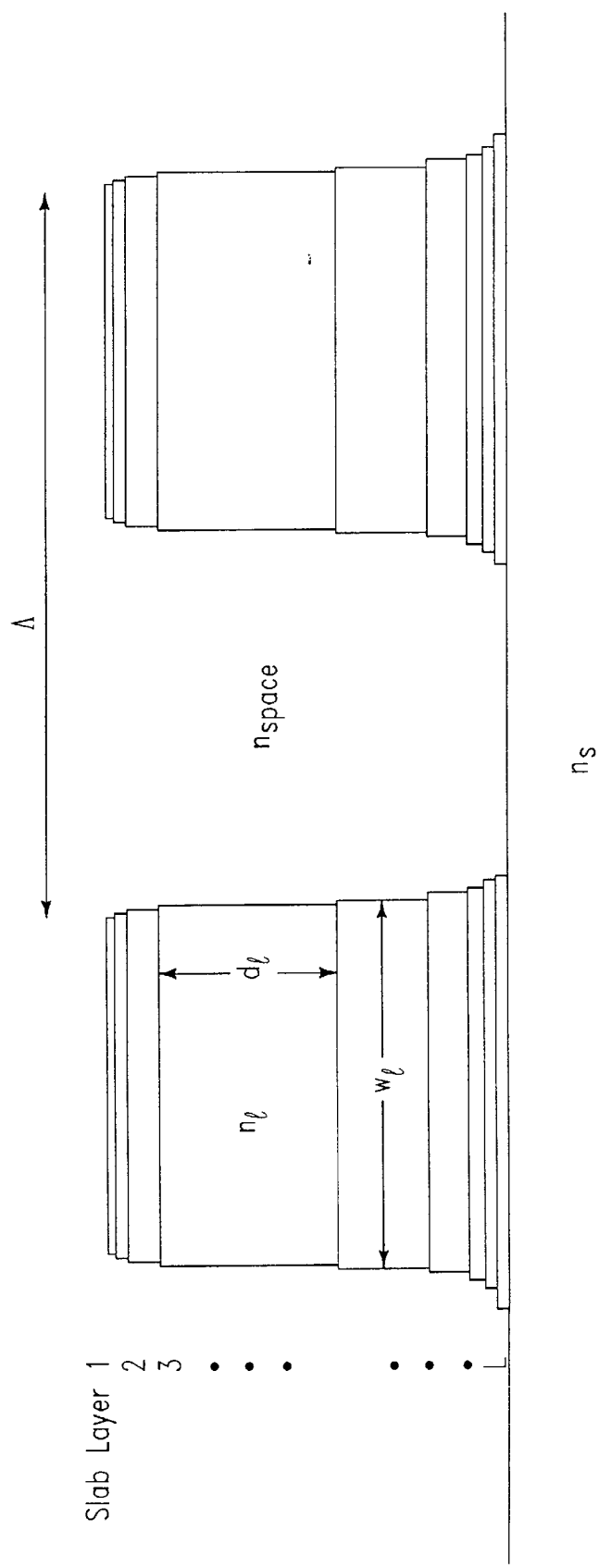
FIG. 7 is a cross section illustrating how a line profile is approximated by a stack of slabs, each slab having a width, a height, and an index of refraction, and showing the grating periodicity.

In the model of the line profile used for predicting intensity versus wavelength, line profile information is expressed as a set of stacked slabs of material, as shown in FIG. 7. Each slab is defined by a width $w_I$, a height $d_I$, and an index of refraction $n_I$. Any profile can be approximated by a series of such stacked slabs. The profile can be made arbitrarily smooth by including a sufficient number of slabs. However, calculation efficiency demands that a minimum number of slabs be used, and by properly adjusting the height and width of each slab, any arbitrary profile can be represented with a minimum number of slabs.

Thus, the method begins with an initial model of the line profile expressed as a series of slabs. This profile is used as an input to a computer program that predicts the percentage of reflected energy diffracted into the zeroth order over a range of wavelengths for the model profile. The predicted intensity is compared to the measured intensity as a function of wavelength (normalized for the incident intensity) and the slab widths and heights are adjusted until agreement between the predicted and measured intensity versus wavelength curves is achieved. The final result of the analysis is a stacked set of slabs that represents the line profile of each line of the grating.

The inventors of the present invention have found that only about 20 slabs are needed to adequately represent many profiles found on semiconductor wafers. Since each slab has two independent values associated with it (a width and a height), two numbers are needed to describe each slab, and about 40 independent variables are needed to approximate a profile. While, in principle, these 40 variables could be adjusted as described above to yield best agreement between measured and predicted diffracted intensity, the computational task of determining the edge profile has been found to be smaller by reducing the number of variables.

In the preferred embodiment of the calculation, the inventors have reduced the number of variables by (1) dividing the model line profile into two or more sub-profiles; and (2) providing a numerical model of each sub-profile wherein a relatively few scaling factors are used to adjust all slab widths and heights within a single sub-profile simultaneously. Thus, the problem is reduced from 40 variables to one having a few variables.

For example, a single scaling factor is used for adjusting all of the width points within each sub-profile and another scaling factor is used for adjusting all of the height points of the "S" line profile of FIGS. 8a–8c. This "S" profile (FIG. 8a) can be viewed as having an upper curved region (FIG. 8b) and a lower curved region (FIG. 8c), each with different curvature. The curvature of the bottom of the S and the top of the S are not known in advance and they may be quite different in magnitudes. This S profile is divided into 2 sub-profiles each formed of many slabs. The widths of all slabs in each sub-profile are varied according to a scaling factor that permits a wide range of sub-profile shapes. The two scaling factors for the two sub-profiles are allowed to vary independently. The height of all slabs in each sub-profile is adjusted by a third scaling factor, and this same scaling factor can be used for both sub-profiles. Thus, the entire S shaped edge profile can be described by three independent variables.

Table 1 illustrates an initial estimate (seed) of the basic shape of the upper sub-profile of the "S"-shaped profile as a table of layer index, X-position, and slab thicknesses ($d_I$). The X-position defines the edge shape and has a reference to zero for both top and bottom such that sub-profile shapes may be modified by scaling factors as described below while maintaining continuity between the sub-profiles.

| l | X | d |
|---|---|---|
| 1 | 0.8 | 0.00025 |
| 2 | 0.75 | 0.00025 |
| 3 | 0.7 | 0.00075 |
| 4 | 0.65 | 0.00125 |
| 5 | 0.6 | 0.002 |
| 6 | 0.55 | 0.00325 |
| 7 | 0.5 | 0.00475 |
| 8 | 0.45 | 0.007 |
| 9 | 0.4 | 0.0095 |
| 10 | 0.35 | 0.013 |
| 11 | 0.3 | 0.01725 |
| 12 | 0.25 | 0.02275 |
| 13 | 0.2 | 0.029 |
| 14 | 0.15 | 0.0365 |
| 15 | 0.1 | 0.046 |
| 16 | 0.05 | 0.0565 |
| 17 | 0 | 0.5 |

Table 2 is a sub-profile seed for the lower portion of the "S"-shape.

| l | X | d |
|---|---|---|
| 18 | −0.05 | 0.0565 |
| 19 | −0.1 | 0.046 |
| 20 | −0.15 | 0.0365 |
| 21 | −0.2 | 0.029 |
| 22 | −0.25 | 0.02275 |
| 23 | −0.3 | 0.01725 |
| 24 | −0.35 | 0.013 |
| 25 | −0.4 | 0.0095 |
| 26 | −0.45 | 0.007 |
| 27 | −0.5 | 0.00475 |
| 28 | −0.55 | 0.00325 |
| 29 | −0.6 | 0.002 |
| 30 | −0.65 | 0.00125 |
| 31 | −0.7 | 0.00075 |
| L = 32 | −0.75 | 0.00025 |

The upper and lower seed profiles of Tables 1 and 2 are shown in FIG. 8a. The magnitude of curvature of the upper sub-profile (Table 1) is changed by allowing the X axis to change by a linear scale factor, $m_1$, so that the X variation of a 'new' sub-profile is given by $$X_l'=m_1X_l \; l=1 \ldots 17$$

where $X_l$ is the initial value of X for the lth slab, $m_1$ is the scale factor, and $X_l'$ is the value of X obtained for the lth slab after applying the scale factor. Slab thickness values $d_l$ in Tables 1 and 2 are retained while the X values change according to the $m_1$ scale factor.

In a similar manner, the lower sub-profile can be adjusted by allowing the X values associated with it to change by a different linear scale factor $$X_l'=m_2X_l \; l=18 \ldots L$$

where $X_l$ is again the initial value of X for the lth slab, $m_2$ is the scale factor for the lower sub-profile, $X_l'$ is the value of X obtained for the lth slab after applying the second scale factor, $m_2$, and L is the index number of the bottom slab, in this case slab 32.

One additional scale factor is recommended for the slab thickness values such that, $$d_l'=m_3d_l \; l=1 \ldots L$$

The scale factors in the method given above allow for a wide range of 'S' shaped curves to represent the line profile that are formed from a seed of initial X and thickness values as modified by three scaling variables, $m_1$, $m_2$, $m_3$. FIG. 8d shows the modeled line profile for $m_1$=2, $m_2$=0.01, and $m_3$=1.2, illustrating the effect of the three scale factors on the seed curve. In addition to linear scale factors, higher order scale factors or scale factors having other functional forms can be used to modify the seed profile.

In practice an additional parameter W will be required to set the effective line width of our grating elements and to define the separation between the symmetric left and right edge profiles of a single line of the grating. The parameter W will explicitly define the width of each slab when used in conjunction with the scaled edge profiles. For example, the width of each slab for the lower profile will be given by $$w_l=2 \; X_l+W \; l=1 \ldots L$$

With this additional parameter, we have reduced the number of parameters to be varied from about 40 to 4. The optimization program is now used to successively change these 4 profile parameters until the gap between measured intensity and predicted intensity versus wavelength is minimized. The inventors have found that the seed chosen to initiate the iterative process is important for the success of the iterative procedure. Thus, an approximate shape obtained from a cross section or atomic force microscopy profile that approximates the shape of the profile will improve the chance of success and decrease the number of iterations required.

Figure 9:
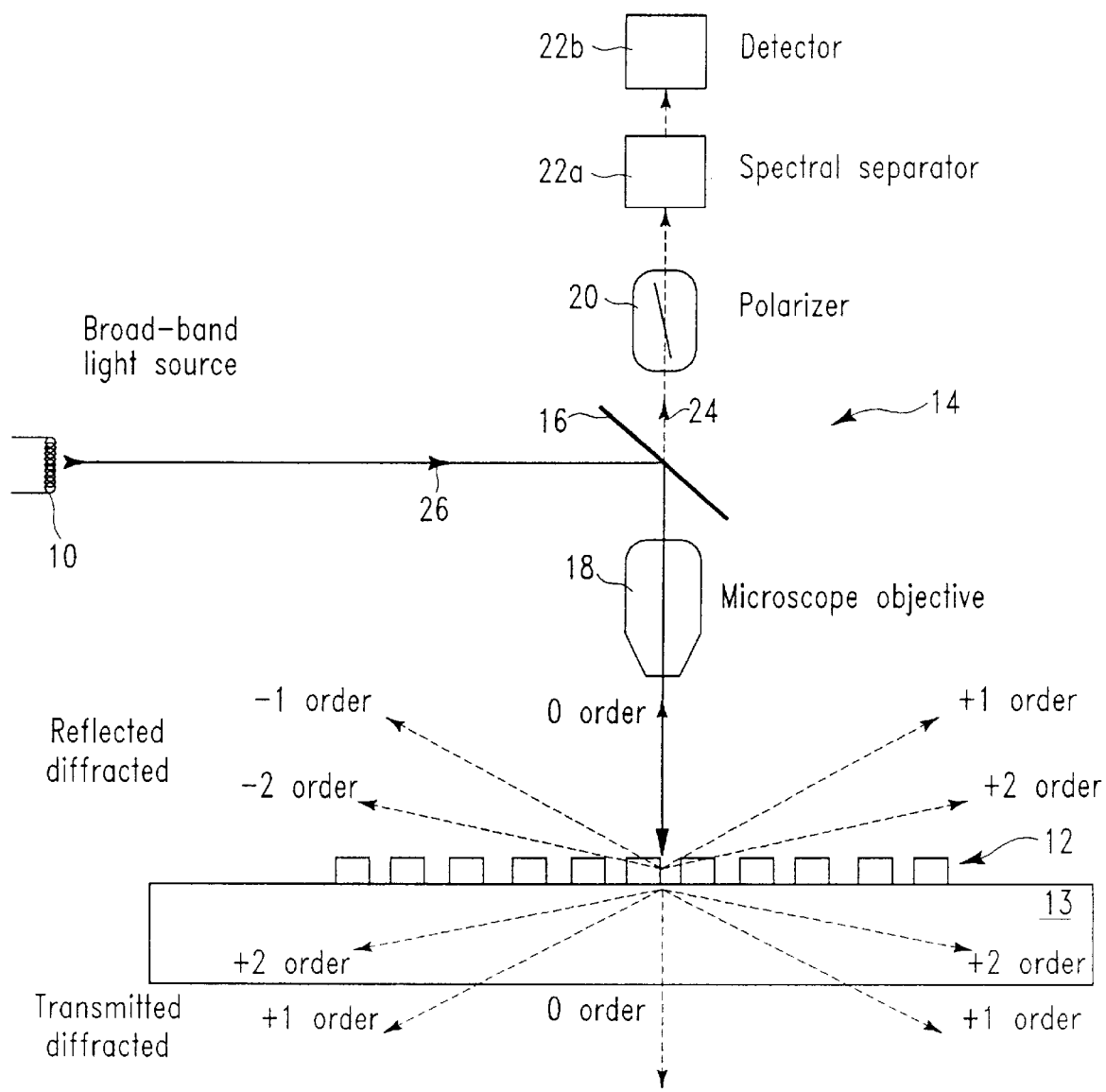
FIG. 9 is a schematic of the apparatus of the present invention.

FIG. 9 shows the apparatus used to measure the actual diffraction vs. wavelength curve of a particular grating. Broadband illumination source 10 is projected on line diffraction grating 12 on substrate 13 through optical apparatus 14, such as partially silvered mirror 16 and optical microscope objective 18. Light incident on grating 12 from objective 18 is diffracted into many diffraction orders, of which orders 0, 1, and 2 are shown for reflected and transmitted diffracted light. The analysis of diffracted energy reflected from absorbing substrates, such as silicon substrates, will be described in detail here. In the present invention, the diffracted light energy associated with one or more of the low orders is collected by microscope objective 18, transmitted through partially silvered mirror 16, polarizer 20, and collected by spectral separator 22a and detector 22b. Polarizer 20 provides a single polarization for the collected light energy to detector 22b, that polarization preferably being either transverse-electric (TE) or transverse-magnetic (TM). While polarizer 20 is shown in detector light path 24, polarizer 20 can also be placed in source light path 26. Although polarized light is preferred, unpolarized light or other polarization states are acceptable if the analysis can account for the situation.

Within spectral separator 22a, the polarized light energy is separated into its spectral components by a monochromator (not shown) and the intensity as a function of wavelength is measured by detector 22b, both of which are well known in the art. The relative reflectivity at each wavelength is then computed from the detected intensity as a function of wavelength. The computation involves a correction for the intensity of the incident light at each wavelength. Since the illumination source does not produce a constant intensity at each wavelength and since the optics of the system change the intensity of different wavelengths differently, it is necessary to normalize the system. This is achieved with a reflectivity reference, such as polished silicon. The reflected intensity as a function of wavelength from the reflectivity reference mounted in the system is measured and the signal compared with the known reflectivity of the reflectivity reference as a function of wavelength. A normalization factor is thereby generated at each wavelength which can be applied to correct the intensity of signals from an actual grating where the reflectivity is to be measured.

Incoming light to grating 12 and diffracted light reflected from grating 12 are shown in FIG. 10. The incident light having wavelength $\lambda_i$ arrives at an incident angle $\theta_i$ from normal. The diffracted light is reflected at angle $\theta_s$ which is given by $$\theta_s = \sin^{-1}\left(\sin\theta_i - \frac{\lambda m}{\Lambda}\right)$$

where m is an integer referred to as the "diffraction order" and $\Lambda$ is the grating period. The diffracted light reflects with a wavelength unchanged by the interaction.

The present inventors have found that choosing an optical path wherein the incident light is normal to the diffraction grating simplifies the calculation of line profile. They have found that the calculation is also tolerant to a small range of angles symmetric around such a normal incident beam. Such illumination is conveniently achieved by using a low numerical aperture objective in the optical microscope. In practice, a numerical aperture less than 0.08 is used.

In addition, the present inventors have designed optical apparatus 14 such that a significant percentage of the diffracted energy is diffracted at angles too large to be collected by objective lens 18; that is, the diffraction angle of the reflected light is outside the numerical aperture of the lens. From the diffraction equation above, it can be seen that the zeroth diffracted order is scattered at the same angle as the incident light. In the preferred embodiment, objective lens 18 and the wavelength range are selected so that only the zeroth diffraction order is collected by the apparatus.

A line profile modeled as a stack of slabs, each with a specific width, height, and complex refractive index used in the present invention, illustrated in FIG. 7, provides a line profile resolution determined by the number of slabs. By increasing the number of slabs comprising the line the shape of the edge profile can be made arbitrarily smooth, while decreasing the number of slabs decreases the time for computing the line profile.

TM polarization solution

In the APL code contained in FIG. 11, Maxwell's equations are solved to provide the electric and magnetic fields and light intensity reflected by a grating in each order for the optical system illustrated in FIG. 10 using a technique generally described in a paper by Morham in the J.Opt.Soc.Am., Vol.12., No.5, May 1995. The reflected diffraction efficiencies (the percentage of light reflected for each diffraction order or reflectivity) are also calculated in the APL code. This code provides the partial solution of Maxwell's equations for reflected diffraction, as needed for line profiles on substrates such as non-transparent semiconductor wafers. While many methods for solving Maxwell's equations are known, the full solution, including both reflected and transmitted light, can be derived following the description in that paper and others by the same author.

In the code of FIG. 11 permitivity harmonics (E) are calculated from the Fourier harmonics of the input parameters (n, f) as shown in the function PERMITIVITY and PERMPRIME. Wavenumber equations (K) are derived in matrix form in the function WAVENUMBER from the input wavelength, grating period, and angle of incidence.

The coupled wave equations, in matrix form, (B; COUPLEDWAVE line 28) result from the requirement that electromagnetic fields satisfy Maxwell's equations in the grating layer. EIGENSTUFF performs the eigenspace calculations to solve the coupled wave equations, producing the eigenvector diagonal matrix (W) and the square root (positive real part) of the eigenvalues as the diagonal matrix (Q) combining with the permittivity (E) to produce the product matrix (V; COUPLEDWAVE line 32).

A system of 2n(L+1) equations (where n is the number of space harmonics retained in the solution and L is the number of grating layers used to form the profile) results from the matching of electromagnetic fields at the grating layer boundaries.

The standard transmittance matrix solution approach can become unstable due to finite computing precision of matrix inversion. Therefore, the solution employed in the code uses the numerically stable transmittance approach to determine the diffracted reflected amplitudes only. This matrix solution method utilizes a set of matrix calculations that cascaded from the first layer to the $L^{th}$ layer (function FANDG called from COUPLEDWAVE line 39). The resulting wave matrix (R; COUPLEDWAVE line 40) is used to calculate the diffracted efficiencies (DERTM; line 42). Calculations for the transverse electric field follow similarly in lines 47 through 60.

The function COUPLEDWAVE is invoked by issuing the APL command, COUPLEDWAVE WL, where WL is a required argument; its value being the wavelength at which to evaluate the theoretical profile. COUPLEDWAVE, as configured in FIG. 11, is set up to compute TM diffraction. To change to TE, remove the comment symbol from line 26 & 63 and add a comment symbol to line 62. COUPLEDWAVE also requires several other variables to be defined in the work space and these are described in Table 3:

TABLE 3

| Variable Name | Format | Purpose |
| --- | --- | --- |
| LAYER | An N by 3 matrix; where N is the number of layers used to build the theoretical profile, column 1 is the layer film ID (see CAUCHY), column 2 is the layer width (nm), and column 3 is the layer thickness (nm). | Describes the theoretical profile of the grating |
| GRATINGPERIOD | A scalar (mn). | The grating period |
| ORDERS | A scalar integer. | The number of positive diffracted orders retained in the analysis. |
| TH | A scalar (degrees). | The angle of incidence. |
| WL | A scalar (nm). | The incident wavelength. |
| CAUCHY | An M by 4 matrix where M is any number of film types for which Cauchy coef. data is known; column 1 is the film ID, cols. 2–4 are Cauchy coefs. C1, C2, & C3. | A lookup matrix of Cauchy coefs. to calculate film refractive index (user supplied). |
| SI | Is a P by 3 matrix where P is the number of refractive index values included, column 1 is the wavelength, cols. 2 and 3 are the real and imaginary parts of the complex refractive index at the given wavelengths. | The complex refractive index of silicon used as the substrate (user supplied). |

GRATING PROFILE

Figure 12:
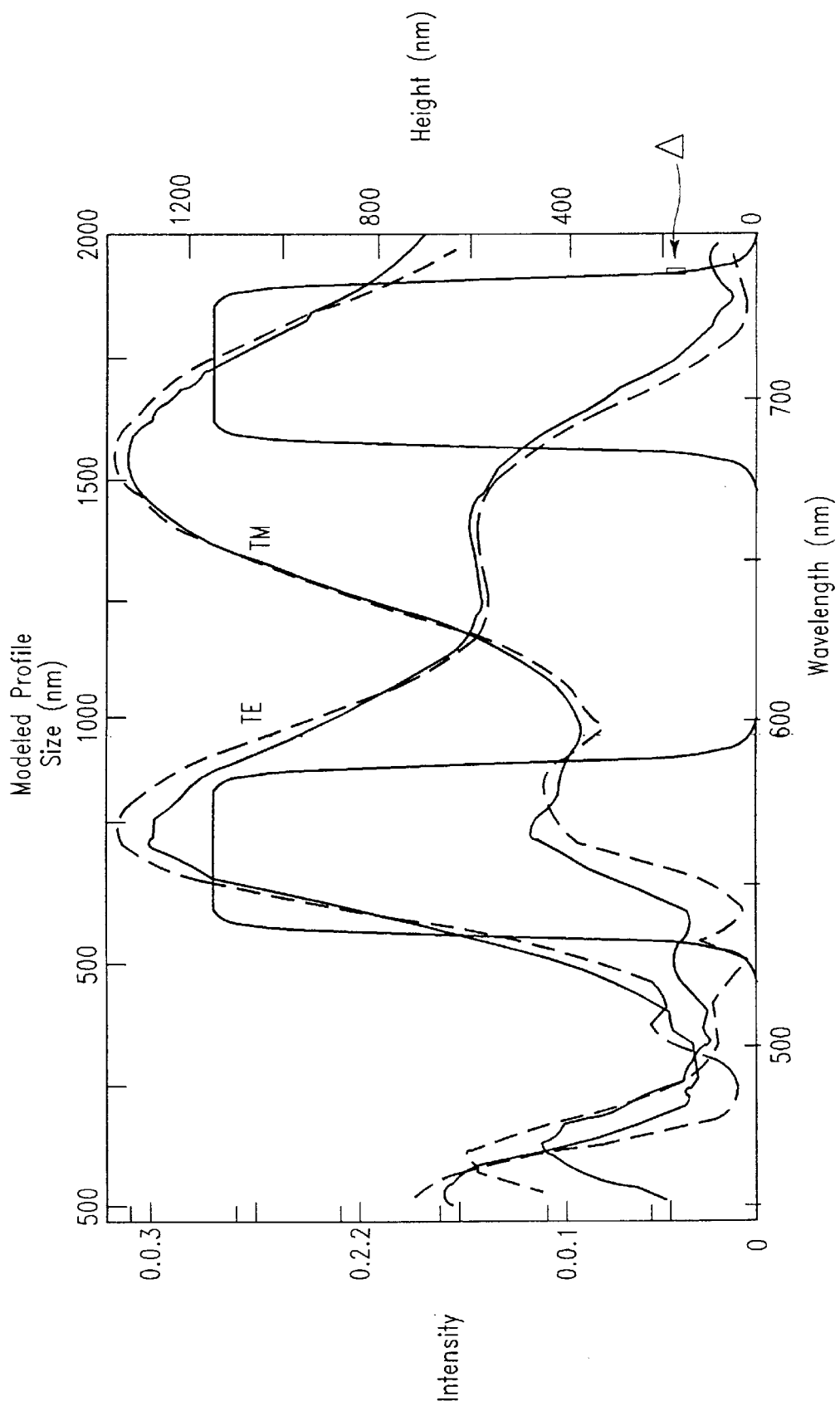
FIG. 12 is a plot of measured reflectivity and theoretical reflectivity (TM and TE) and the corresponding line profiles for TM and TE calculated according to the method of the present invention.

FIG. 12 shows a line profile result of the present invention for reflectivity versus wavelength data taken from a photoresist line on a silicon substrate. The profile was calculated independently from two normal polarizations, transverse magnetic (TM) and transverse electric (TE). In the case of TM, the magnetic field vectors are perpendicular to the lines of the grating whereas electric filed vectors are always perpendicular to magnetic field vectors. Therefore, TE polarization has electric field vectors perpendicular to the lines of the grating. The different polarization orientations may be obtained by rotating the polarizer in the optical path so only light having the polarization of interest is collected.

To minimize analysis time, it is convenient to select either the TE or the TM polarization. In this way only the normalized reflected intensity for a single polarization needs to be calculated. In FIG. 12 the line profile as calculated with both TE and TM is shown. The figure shows close agreement between the calculated intensity versus wavelength curves and the actual intensity versus wavelength curves for both TE and TM. Both give almost identical line profiles.

The present invention can also be applied to calculating the line profile of trenches. For example, the edge shape profile of a phase shift structure on a quartz mask, which is a trench etched in the quartz, can be calculated with the present invention. In this case, either the transmitted or the reflected diffracted energy can be used to determine the depth and edge profile. Similarly, edge profiles of trenches in a semiconductor substrate can be calculated. Two dimensional line profiles of gratings, such as contacts or DRAM cell capacitor trenches, as shown in FIGS. 13a–13c can also be calculated by extending the formalism for solving Maxwell's equations to two dimensions.

Figure 14A:
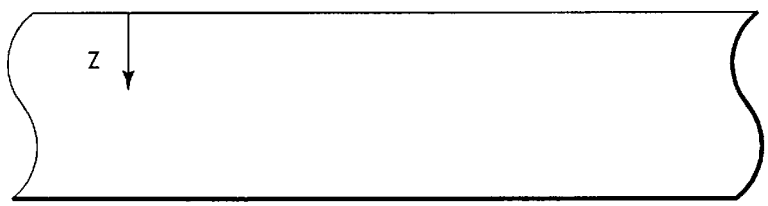
FIG. 14a is a cross sectional view of a semiconductor substrate having a doping that varies with depth into the substrate, the depth profile of which can be calculated according to the present invention.
Figure 14B:
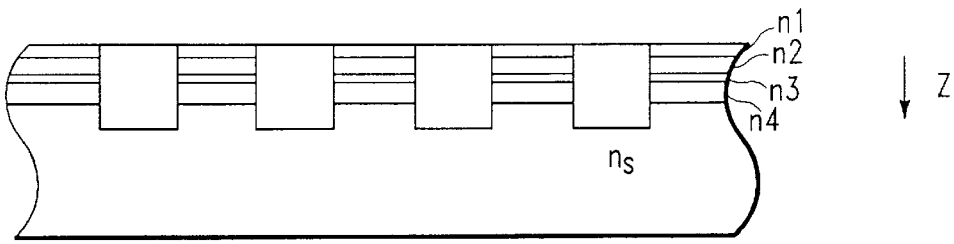
FIG. 14b is a cross sectional view of a substrate having film layers of varying thickness and index of refraction, the depth profile of which can be calculated according to the present invention.
Figure 14C:
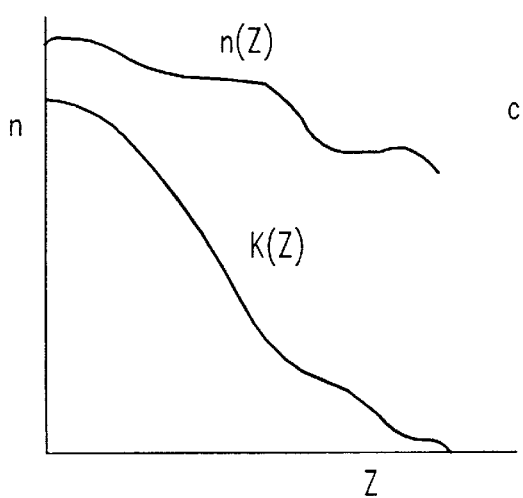
Figure 14D:
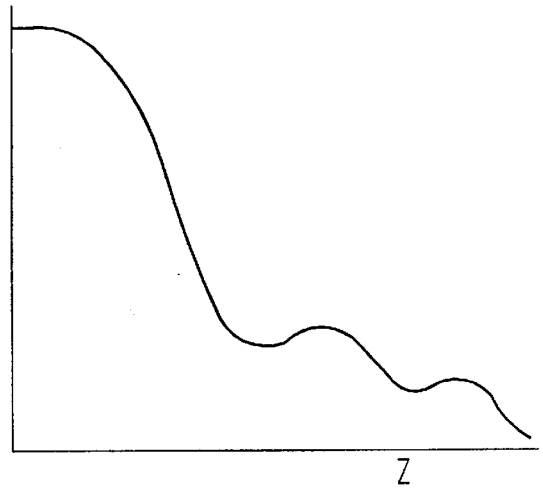
FIG. 14d shows the concentration versus depth profile as converted from the index of refraction curves of FIG. 14c.

In addition to calculating line profiles, the present invention can be applied to calculating other types of optically sensitive profiles, including doping profiles and composition profiles. In semiconductor manufacturing, it is important to control the concentration of dopants as a function of depth. FIG. 14a an implanted semiconductor having a doping concentration c(z) near the surface that varies with depth, z. It is well known that the optical characteristics of silicon vary significantly with dopant concentration in the infra-red optical range, from a wavelength of about 1 um to a wavelength of about 40 um. In the first step a grating of suitable period is etched into the doped silicon to diffract the first order outside the range of the detected angles, as described hereinabove. Preferably the sidewalls of the grating have a straight vertical line profile, as shown in FIG. 14b, to simplify the calculation exclusively to the varying optical properties. In the next step, the grating is illuminated with the broad band infrared radiation. The diffracted normalized intensity versus wavelength is measured as described hereinabove. A seed model of the index of refraction depth profile is provided to a data processing machine and the process described hereinabove is used to calculate a normalized intensity versus wavelength curve for comparison with the measured curve. The model is adjusted to improve agreement and the calculation repeated until convergence is achieved as described hereinabove. The index of refraction depth profile of FIG. 14c is then converted into a doping profile using, for example, published tables relating index and doping concentration, as shown in FIG. 14d.

Figure 15:
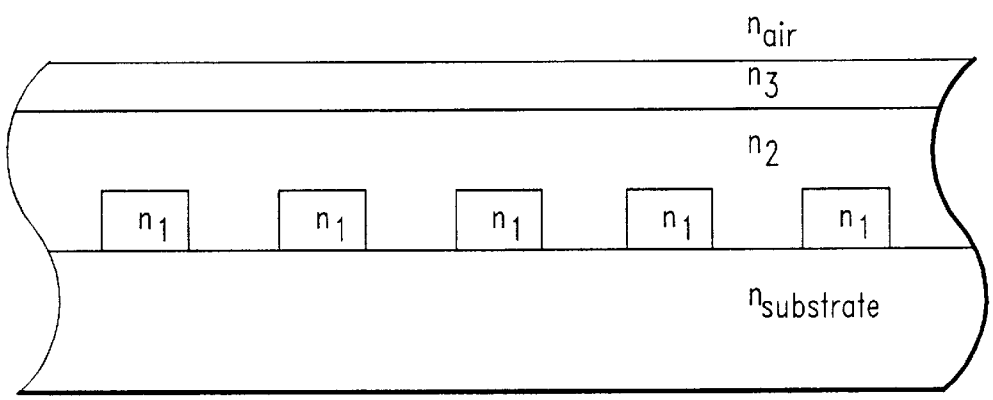
FIG. 15 shows a cross sectional view of a buried grating.

The present method can be applied to calculate the thickness and index of refraction of a stack of optical coatings, such as antireflective coatings on a lens. An edge of the lens or a monitor lens could be used for the grating. The present invention can also be applied to calculating the line profile and index profiles of buried structures, such as those shown in FIG. 15. The various indices and thicknesses of the layers can be determined as described hereinabove.

While several embodiments of the invention, together with modifications thereof, have been described in detail herein and illustrated in the accompanying drawings, it will be evident that various further modifications are possible without departing from the scope of the invention. For example, a library of line profile curves can be used instead of or in combination with iterating from a seed profile. Nothing in the above specification is intended to limit the invention more narrowly than the appended claims. The examples given are intended only to be illustrative rather than exclusive.

What is claimed is:

1. A method of determining a profile, comprising the steps of:
   (a) providing a substrate having a repeating structure comprising a plurality of lines, said lines having substantially identical profiles;
   (b) illuminating said repeating structure with radiation wherein said radiation diacts, said diffracted radiation having an intensity;
   (c) measuring said intensity;
   (d) providing a model structure on a data processing machine, said model structure comprising a repeating structure on said substrate, said model structure comprising a model profile, wherein said model profile comprises an edge having more than one X position;
   (e) mathematically predicting a predicted diffracted radiation intensity when said model structure is illuminated with said radiation; and
   (f) comparing said predicted intensity with said measured intensity.

2. A method as recited in claim 1, further comprising the step of adjusting said model structure and repeating said steps (e) and (f) to improve agreement in said comparing step (f).

3. A method as recited in claim 1, wherein said model structure is one of a library of model structures.

4. A method as recited in claim 1, wherein said profile comprises a line edge profile.

5. A method as recited in claim 1, wherein said profile comprises a composition versus depth profile.

6. A method as recited in claim 5, wherein composition varies with depth according to a doping profile.

7. A method as recited in claim 5, wherein composition varies with depth according to layering of films on a substrate.

8. A method as recited in claim 1, wherein said lines comprise a film on said substrate, said film having a film thickness and a film index of refraction, said substrate having a substrate index of refraction.

9. A method as recited in claim 1, wherein said plurality of lines comprises at least 5 lines.

10. A method as recited in claim 1, wherein said diffracted radiation of said step (b) is reflected.

11. A method as recited in claim 1, wherein said radiation is light.

12. A method as recited in claim 11, wherein in said illuminating step (b) said light has a range of wavelengths.

13. A method as recited in claim 12, wherein said wavelength range comprises about 450 nm to about 750 nm.

14. A method as recited in claim 12, wherein said wavelength range comprises about 1 um to about 40 um.

15. A method as recited in claim 1, wherein said radiation diffracts with an intensity as a function of wavelength and, wherein, in said measuring step (c), measuring said intensity as a function of wavelength.

16. A method as recited in claim 1, wherein in said predicting step (e), mathematically predicting the intensity of radiation that would be reflected from the model as a function of wavelength.

17. A method as recited in claim 1, wherein in said illuminating step (b), illuminating said substrate at a range of incident angles near normal.

18. A method as recited in claim 17, wherein said range of incident angles is equal to or less than about 5 degrees from normal.

19. A method as recited in claim 18, wherein said illuminating step illuminates said substrate through a lens having a numerical aperture of less than about 1.

20. A method as recited in claim 1, wherein said diffracted light is measured at a fixed range of angles.

21. A method as recited in claim 20, wherein said range is equal to or less than about 5 degrees.

22. A method as recited in claim 21, wherein light incident on said lines is reflected and diffracted by said plurality of lines into a plurality of orders including a zeroth order, further wherein, said range being set to limit measured light to said zeroth order, light in other orders being diffracted at an angle larger than said fixed range of angles.

23. A method as recited in claim 22, wherein said model further comprises a range of incident angles, an incident light wavelength range, a range of reflected angles, a film index of refraction, and a substrate index of refraction, and wherein said line profile includes line width, edge shape, and film thickness.

24. A method as recited in claim 23, wherein said mathematical predicting step (d) comprises using the range of incident angles, the range of incident wavelengths, the range of reflected angles, and Maxwell's equations to predict the amount of light that would be reflected from the model profile.

25. A method as recited in claim 24, wherein said lines comprise one of photoresist lines, metal lines, insulator lines, multiple composite stacks, planarized embedded profiles, and phase-shift masks.

26. A method as recited in claim 24, further comprising the step of adjusting said model structure and repeating said steps (e) and (f) to improve agreement in said comparing step (f) until said predicted intensity and said measured intensity agree within a convergence limit, wherein, after said convergence is achieved said model line profile describes said line profile.

27. A method of determining the profile of a repeating structure comprising the steps of:
   (a) providing a substrate having a plurality of lines having substantially identical line profiles and spacings;
   (b) illuminating said lines with radiation having a range of wavelengths, wherein said radiation reflects with an intensity as a function of wavelength;
   (c) measuring the intensity of radiation reflected from said lines as a function of wavelength;
   (d) providing a model of the line profile and line spacing, wherein said model of the line profile comprises an edge having more than one X position;
   (e) mathematically predicting the intensity of radiation that would be reflected from the model as a function of wavelength; and
   (f) comparing the predicted intensity with the measured intensity; and
   (g) adjusting the model and repeating steps (e) and (f) to improve agreement in said comparing step (f).

28. An apparatus for determining the profile of a line on a substrate, the apparatus comprising:
   a radiation source for illuminating the substrate with radiation, said substrate comprising a repeating structure, said repeating structure comprising a plurality of lines and spaces between said lines, said lines having substantially the same line profile, said spaces being substantially identical, the illuminating of the repeating structure for obtaining diffraction of said radiation, wherein said diffracted radiation has an intensity;
   a polarizer for selecting a single polarization of light of incident or diffracted light;
   a detector for measuring said intensity;
   a data processing machine comprising a computer model structure, said model structure comprising a model repeating structure on a model substrate, said repeating structure comprising a plurality of model lines and model spaces between said model lines, said model lines having substantially the same model line profile, each said model line comprising an edge having more than one X position, said model spaces being substantially identical, said data processing machine for mathematically predicting a predicted diffracted radiation intensity when said model structure is illuminated with said radiation source;
   said data processing machine further comprising means for comparing said predicted intensity with said measured intensity; and
   said data processing machine further comprising means for adjusting said model structure and for repeating said predicting and comparing steps to improve agreement in said comparing step.

* * * * *

(12) EX PARTE REEXAMINATION CERTIFICATE (6449th)
United States Patent
Conrad et al.

(10) Number: US 5,963,329 C1
(45) Certificate Issued: Sep. 23, 2008

(54) METHOD AND APPARATUS FOR MEASURING THE PROFILE OF SMALL REPEATING LINES

(75) Inventors: Edward W. Conrad, Jeffersonville, VT (US); David P. Paul, Essex Junction, VT (US)

(73) Assignee: Nanometrics Incorporated, Milpitas, CA (US)

Reexamination Request:
No. 90/006,185, Jan. 10, 2002

Reexamination Certificate for:
Patent No.: 5,963,329
Issued: Oct. 5, 1999
Appl. No.: 08/961,929
Filed: Oct. 31, 1997

(51) Int. Cl.
*G01B 11/24* (2006.01)
*G01B 11/00* (2006.01)
*G01B 11/02* (2006.01)

(52) U.S. Cl. .................. 356/613; 356/601; 356/612
(58) Field of Classification Search ............ 356/601, 356/602, 609, 612, 613
See application file for complete search history.

(56) References Cited

U.S. PATENT DOCUMENTS

| | | | |
|---|---|---|---|
| 4,172,664 A | 10/1979 | Charsky et al. | 356/356 |
| 4,555,767 A | 11/1985 | Case et al. | |
| 4,672,196 A | 6/1987 | Canino | 250/225 |
| 5,007,708 A | 4/1991 | Gaylord et al. | 350/162.2 |
| 5,035,770 A | 7/1991 | Braun | 156/643 |
| 5,042,951 A * | 8/1991 | Gold et al. | 356/369 |
| 5,045,704 A | 9/1991 | Coates | 250/372 |
| 5,191,216 A | 3/1993 | Henderson et al. | 257/28 |
| 5,216,680 A | 6/1993 | Magnusson et al. | 372/20 |
| 5,337,146 A | 8/1994 | Azzam | 356/367 |
| RE34,783 E | 11/1994 | Coates | 250/372 |
| 5,555,474 A | 9/1996 | Ledger | 356/381 |
| 5,596,406 A | 1/1997 | Rosencwaig et al. | |
| 5,607,800 A | 3/1997 | Ziger | 430/8 |

(Continued)

FOREIGN PATENT DOCUMENTS

| | | |
|---|---|---|
| EP | 0 402 191 A1 | 12/1990 |
| EP | 0 402 191 B1 | 12/1990 |
| JP | 11-211421 | 8/1999 |
| JP | 11-211422 | 8/1999 |
| SU | 1747877 A1 | 7/1992 |

OTHER PUBLICATIONS

"Spectroscopic Pitch Measurement Technique", IBM Technical Disclosure Bulletin, vol. 32, No. 43, Sep. 1989, pp. 391–392.

(Continued)

*Primary Examiner*—Hoa Q. Pham

(57) ABSTRACT

A method for nondestructively determining the line profile or topographical cross-section of repeating lines on a substrate is provided, including line thickness, line width, and the shape of the line edge. A substrate having a repeating structure, such as a grating, is illuminated with broad-band radiation. Diffracted radiation is collected, measured, and recorded as a function of wavelength to provide an intensity versus wavelength curve. An initial model of the line profile of the grating, a model of the broad band radiation shined on the grating, and a model of the interaction of the radiation with the model grating is provided to a data processing machine. The machine uses Maxwell's equations to calculate a model diffracted intensity versus wavelength curve, and the measured intensity curve is then compared with this modeled intensity versus wavelength curve. The line profile in the model is then adjusted and the model intensity curve recalculated to improve agreement between the measured and calculated intensity curves. The model is repeatedly adjusted and the intensity recalculated until the best agreement between the two intensity versus wavelength curves is achieved, thereby providing the line profile. The method similarly provides composition profiles, such as doping depth profiles and optical coating profiles by taking advantage of the relationship between index of refraction and composition.

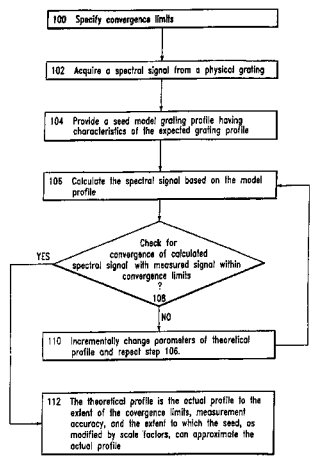

U.S. PATENT DOCUMENTS

| | | | |
|---|---|---|---|
| 5,739,909 A | 4/1998 | Blayo et al. | |
| 5,747,813 A | 5/1998 | Norton et al. | 250/372 |
| 5,841,139 A | 11/1998 | Sostek et al. | 250/339.12 |
| 5,867,276 A | 2/1999 | McNeil et al. | |
| 5,880,838 A | 3/1999 | Marx et al. | 356/351 |
| 5,889,593 A | 3/1999 | Bareket | 356/445 |
| 6,366,861 B1 | 4/2002 | Waldhauer et al. | 702/35 |

OTHER PUBLICATIONS

"Phase–sensitive Overlay Analysis Spectrometry", IBM Technical Disclosure Bulletin, vol. 32, No. 10A, Mar. 1990, pp. 170–174.

U.S. Appl. No. 10/116,863, filed Apr. 4, 2002, Weidong Yang.

U.S. Appl. No. 10/116,798, filed Apr. 4, 2002, Weidong Yang.

U.S. Appl. No. 10/261,547, filed Sep. 30, 2002, Weidong Yang.

U.S. Appl. No. 09/670,000, filed Sep. 25, 2000, James M. Holden.

U.S. Appl. No. 10/085,832, filed Feb. 27, 2002, James M. Holden.

U.S. Appl. No. 09/844,559, filed Apr. 27, 2001, William A. McGahan.

U.S. Appl. No. 09/960,892, filed Sep. 20, 2001, Roger R. Lowe–Webb.

U.S. Appl. No. 09/898,641, filed Jul. 3, 2001, Pablo I. Rovira.

Ahmed, S., et al., "Comparison of beam propagation method and rigorous coupled–wave analysis for single and multiplexed volume gratings", Applied Optics, vol. 35, No. 22, Aug. 1, 1996, pp. 4426–4435.

Chang, N. Y., et al., "Algorithm based on rigorous coupled–wave analysis for diffractive optical element design", J. Opt. Soc. Am. A, Opt. Image Sci. Vis. (USA), vol. 18, No. 10, Oct. 2001, pp. 2491–2501.

Glytsis, E. N. et al., "Review of rigorous coupled–wave analysis and of homogeneous effective medium approximations for high spatial–frequency surface–relief", In NASA. Marshall Space Flight Center, Conference on Binary Optics: An Opportunity for Technical Exchange Feb. 23–25, 1993, p. 61–76.

Han, Chang–Wook, et al., "Rigorous coupled–wave analysis of antireflective surface–relief gratings", J. Opt. Soc. Korea (South Korea) vol. 1, No. 1, Mar. 1997, pp. 26–35.

Henderson, G. N., "Semiconductor quantum electron wave transport, diffraction, and interference: analysis, device, and measurement", Dissertation Georgia Institute Of Technology, vol. 54–10B, 1993, pp. 5312 209 page(s).

Lee, S. G., et al., "More stable algorithm for rigorous coupled wave analysis applied to topography simulation in optical lithography and its numerical implementation", Proc. SPIE—Int. Soc. Opt. Eng. (USA), vol. 2726, 1996, pp. 288–298.

Moharam, M.G. et al, "Rigorous Coupled–Wave Analysis of Grating Diffraction—E–mode polarization and losses", Jnl. of the Optical Society of America, vol. 73, No. 4, Apr. 83, p. 451–455.

Moharam, M.G. et al, "Rigorous coupled–wave analysis of metallic surface–relief gratings" Optical Society of America, Journal, A: Optics and Image Science Optical Society of America, Journal, A: Optics and Image Science, vol. 3, Nov. 1986, p. 1780–1787.

Peng, Song, et al., "Efficient and stable implementation of rigorous coupled–wave analysis for surface–relief gratings", Proc. SPIE—Int. Soc. Opt. Eng. (USA), vol. 2532; 1995, pp. 475–480.

Peng, Song, et al., "Efficient implementation of rigorous coupled–wave analysis for surface–relief gratings", Journal of the Optical Society of America A: Optics and Image Science, and Vision, vol. 12, No. 5, May 1995, p. 1087–1096.

Press, W. et al., "Numerical Recipes: The Art of Scientific Computing,", Cambridge University Press, Section 14.4 (1986), pp. 521–528.

Zylberberg, Z. et al., "Rigorous coupled–wave analysis of pure reflection gratings" Optical Society of America, Journal, vol. 73, Mar. 1983, p. 392–398.

Bao, G. et al., "Mathematical studies in rigorous grating theory", *J. Opt. Soc. Am. A,* vol. 12, No. 5 (1995), pp. 1029–1042.

Benson, T. et al., "In–situ Spectroscopic Reflectometry for Polycrystalline Silicon Thin Film Etch Rate Determination During Reactive Ion Etching", Dept. of Electrical Engineering & Computer Science an the Center for Display Technology & Manufacturing, University of Michigan, pp. 1–34.

Bischoff, J. et al., "Single feature metrology by means of light scatter analysis", *SPIE* vol. 3050 (1997) pp. 574–589.

Bosenberg, W. et al., "Linewidth Measurement on IC Wafers by Diffraction from Grating Test Patterns", *Solid State Technology,* vol. 26, No. 7 (1983) pp. 79–85.

Brauer, R. et al., "Electromagnetic diffraction analysis of two–dimensional gratings", Optics Communications, vol. 100 (1993) pp. 1–5.

Chateau, N. et al., "Algorithm for the rigorous coupled–wave analysis of grating diffraction," *J. Opt. Soc. Am. A,* vol. 11, No. 4 (1994), pp. 1321–1331.

Corle, T., et al., "Polarization–enhanced imaging of photoresist gratings in the real–time scanning optical microscope", *Applied Optics,* vol. 33, No. 4 (1994) pp. 670–677.

Coulombe, S. et al., "Ellipsometric–Scatterometry for sub–01. μm CD measurements" *SPIE* vol. 3332 (1988) pp. 282–292.

Damar, H. et al., "Diffraction Characterization for Process Monitoring, Linewidth Measurement and Alignment" *SPIE* vol. 470 (1984) pp. 157–163.

Davidson, M. et al., "A comparison between rigorous light scattering methods", *SPIE* vol. 3051 (1997) pp. 606–619.

Gaylord, T. et al., "Analysis and Applications of Optical Diffraction by Gratings," *Proceedings of the IEEE,* vol. 73, No. 5, (1985), pp. 894–937.

Glytsis, E. et al., "Rigorous Coupled–Wave Analysis and Applications Of Grating Diffraction", *Critical Reviews Of Optical Science and Technology,* vol. CR49 (1993), pp. 1–31.

Glytsis, E. et al., "Three–dimensional (vector) rigorous coupled–wave analysis of anisotropic grating diffraction", *J. Opt. Soc. Am. A,* vol. 7, No. 8 (1990), pp. 1399–1420.

Han, S. et al., "Electromagnetic scattering of two–dimensional surface–relief dielectric grating", *Applied Optics,* vol. 31, No. 13 (1992) pp. 2343–2352.

Hauge, P., "Recent Developments in Instrumentation in Ellipsometry", Surface Science 96, (1980) pp. 108–140.

Haverlag, M. et al., "In situ ellipsometry and reflectometry during etching of patterned surfaces: Experiments and simulations", *Journal of Vacuum Science & Technology B,* vol. 10, No. 6 (1992) pp. 2412–2418.

Heimann, P. et al., "Optical Etch–Rate Monitoring: Computer Simulation of Reflectance", *Journal Electrochem. Soc.*, vol. 131, No. 4 (1984) pp. 881–885.

Kleinknecht, H. et al., "Linewidth measurement on IC masks and wafers by grating test patterns", *Applied Optics*, vol. 19, No. 4 (1980) pp. 525–533.

Kong, W. et al., "Analysis of Time–Evolved Spectroscopic Ellipsometry Data from Patterned Structures for Etching Process Monitoring and Control", Dept. of Electrical Engineering and Computer Science, University of Michigan, Four pages.

Krukar, R. et al., "Reactive ion etching profile and depth characterization using statistical and neural network analysis of light scattering data", *J. Appl. Phys.*, vol. 74, No. 6 (1993) pp. 3698–3706.

Krukar, R. et al., Overlay and Grating Line Shape Metrology Using Optical Scatterometry (unclassified) DARPA I 1993 Final Report, (Oct. 11, 1993) Thirty–six pages.

Marx, D. et al., "Polarization quadrature measurement of subwavelength diffracting structures", *Applied Optics*, vol. 36, No. 25 (1997), pp. 6434–6440.

McNeill, J. et al., "Scatterometry Applied to Microelectronics Processing" *Microlithography World* (1992) pp. 16–22.

Mills, D. et al., "Spectral ellipsometry on patterned wafers," *SPIE*, vol. 2637 (1995) pp. 194–203.

Moharam, M., "Coupled–Wave Analysis of Two–Dimensional Dielectric Gratings", *SPIE* vol. 883 (1988) pp. 8–11.

Moharam, M. et al., "Three–dimensional vector coupled–wave analysis of planar–grating diffraction", *J. Opt. Soc. Am.*, vol. 73, No. 9 (1983), pp. 1105–1112.

Moharam, M. et al., "Rigorous coupled–wave analysis of planar–grating diffraction", *J. Opt. Soc. Am.*, vol. 71, No. 7 (1981) pp. 811–818.

Moharam, M. et al., "Diffraction characteristics of photoresist surface–relief gratings" *Applied Optics*, vol. 23, No. 18 (1984) pp. 3214–3220.

Sun, J. et al., "Profile Measurement on IC Wafers by Holographic Interference", *SPIE* vol. 673 (1986) pp. 135–143.

Tadros, K., "Understanding metrology of polysilicon gates through reflectance measurements and simulation", *SPIE* vol. 1464 (1991) pp. 177–186.

Tu, K. et al., "Multiple–scattering theory of wave diffraction by superposed volume gratings", *J. Opt. Soc. Am. A.*, vol. 7, No. 8 (1990), pp. 1421–1435.

Ziger, D. et al., "Linesize effects on ultraviolet reflectance spectra", *Society of Photo–Optical Instrumentation Engineers* (1997), Paper 37046.

Bishop, K. P. et al., "Grating line shape characterization using scatterometry", *SPIE*, vol. 1545 (1991) pp. 64–73.

Bishop, K. P. et al., "Use of scatterometry for resist process control", *Proc. SPIE—Int. Soc. Opt. Eng.*, vol. 1673 (1992) pp. 441–452.

Gaspar, S. M. et al., "Laser scatterometry for process characterization", *AIP Conference Proceedings*, vol. 227, No. 1, (1991) pp. 54–55.

Hatab, Ziad R. et al., "Sixteen–megabit dynamic random access memory trench depth characterization using two–dimensional diffraction analysis", *J. Vac. Sci. Technol. B*, vol. 13, No. 2 (1995) pp. 174–182.

Hickman, K. C. et al., "Use of diffracted light from latent images to improve lithography control", *J. Vac. Sci. & Tech. B*, vol. 10, No. 5 (1992) pp. 2259–2266.

Krukar, R. H. et al., "Analyzing simulated and measured optical scatter for semiconductor process verification", *Proc. SPIE—Int. Soc. Opt. Eng.*, vol. 1907 (1993) pp. 238–249.

Krukar, R. H. et al., "Using scattered light modeling for semiconductor critical dimension metrology and calibration", *Proc. SPIE—Int. Soc. Opt. Eng.*, vol. 1926 (1993) pp. 60–71.

Krukar, R. H. et al., "Wafer examination and critical dimension estimation using scattered light" *Proc. SPIE—Int. Soc. Opt. Eng.*, vol. 1661 (1992) pp. 323–332.

McNeil, J. R. et al., "Scatterometry applied to microelectronics processing", *Solid State Technol.*, vol. 36, No. 3 (1993) pp. 29–30.

McNeil, J. R., et al., "Scatterometry applied to microelectronics processing" *Solid State Technol.* vol. 36, No. 4 (1993) pp. 53–56.

Milner, L. M et a., "Latent image exposure monitor using scatterometry", *SPIE Proceedings*, vol. 1673 (1992), 10 pages.

Milner, L. M. et al., "Lithography process monitor using light diffracted from a latent image", *Proc. SPIE—Int. Soc. Opt. Eng.*, vol. 1926 (1993) pp. 94–105.

Minhas, B. K. et al., "Towards sub–0.1 mu m CD measurements using scatterometry", *Proc. SPIE—Int. Soc. Opt. Eng.*, vol. 2725 (1996) pp. 729–739.

Murnane, M. R. et al., "Scatterometry for 0.24–0.70 um developed photoresist metrology", *SPIE*, vol. 2439 (1995) pp. 427–436.

Murnane, M. R. et al., "Subwavelength photoresist grating metrology using scatterometry", *Proc. SPIE—Int. Soc. Opt. Eng.*, vol. 2532 (1995) pp. 251–261.

Naqvi, S. S. H. et al., "Etch depth estimation of large–period silicon gratings with multivariate calibration of rigorously simulated diffraction profiles", *J. Opt. Soc. Am. A*, vol. 11, No. 9 (1994) pp. 2485–2493.

Prins, S. L. et al., "Scatterometric sensor for PEB process control", *Proc. SPIE—Int. Soc. Opt. Eng.*, vol. 2725 (1996) pp. 710–719.

Raymond, C. J. et al., "Multiparameter CD measurements using scatterometry", *Proc. SPIE—Int. Soc. Opt. Eng.*, vol. 2725 (1996) pp. 698–709.

Raymond, C. J. et al., "Multiparameter grating metrology using optical scatterometry" *J. of Vac. Sci. Tech. B*, vol. 15, No. 2 (1997) pp. 361–368.

Raymond, C. J. et al., "Multi–parameter process metrology using scatterometry", *Proc. SPIE—Int. Soc. Opt. Eng.*, vol. 2638 (1995) pp. 84–93.

Raymond, C. J. et al., "Scatterometry for CD measurements of etched structures", *Proc. SPIE—Int. Soc. Opt. Eng.*, vol. 2725 (1996) pp. 720–728.

Sohail, S. et al., "Linewidth measurement of gratings on photomasks: a simple technique", *Applied Optics*, vol. 31, No. 10 (1992) pp. 1377–1384.

Sohail, S. "A simple technique for linewidth measurement of gratings on photomasks", *Proc. SPIE—Int. Soc. Opt. Eng.*, vol. 1261 (1990) pp. 495–504.

Sohail, S. et al. "Grating parameter estimation using scatterometry" *Proc. SPIE—Int.Soc. Opt. Eng.*, vol. 1992 (1993) pp. 170–180.

Sohail, S. et al., "Diffractive techniques for lithographic process monitoring and control", *J. Vac. Sci. Technol. B*, vol. 12, No. 6 (1994) pp. 3600–3606.

Wilson, S. M. G. et al., "Phase shift mask metrology using scatterometry", *Proc. SPIE—Int. Soc. Opt. Eng.,* vol. 2322 (1994) pp. 305–315.

Raymond, C. J. et al., "Resist and Etched line profile characterization using scatterometry", *Proc. SPIE—Int. Soc. Opt. Eng.,* vol. 3050 (1997) pp. 476–486.

Christopher J. Raymond et al., "Metrology of Subwavelength Photoresist Gratings Using Optical Scatterometry," *Journal of Vacuum Science & Technology,* B, vol. 13, No. 4, Jul./Aug. 1995, pp. 1484–1495 (hereinafter the "Raymond I Article").

Christopher J. Raymond et al., "Resist and etched line profile characterization using scatterometry", *SPIE,* vol. 3050, Feb. 1997, pp. 476–486 (hereinafter the "Raymond II Article").

S. Sohail et al., "Scatterometry and the Simulation of Diffraction–Based Metrology", *Microlithography World,* Jul./Aug./Sep. 1993, pp. 5–16 (hereinafter the "Sohail Article").

Lochbihler et al., "Characterization of Highly Conducting Wire Gratings Using an Electromagnetic Theory of Diffraction," *Optic Communications,* vol. 100, 1993, pp. 231–239 (hereinafter the "Lochbihler I Article").

Lochbihler et al., "Characterization of X–Ray Transmission Gratings," *Applied Optics,* vol. 31, No. 7, Mar. 1992, pp. 964–971 (hereinafter the "Lochbihler II Article").

R.M.A. Azzam and N.M. Bashara, "Ellipsometry and Polarized Light", 1992 (1st ed. 1977), pp. 476–481 (hereinafter the "Azzam Book").

M.G. Moharam et al., "Diffraction Characteristics of Photoresist Surface–Relief Gratings," *Applied Optics,* vol. 23, No. 18, Sep. 1984, pp. 3214–3220 (hereinafter the "Moharam I Article").

M.G. Moharam et al., "Stable Implementation of the Rigorous Coupled–Wave Analysis for Surface–Relief Gratings: Enhanced Transmittance Matrix Approach," *Journal of the Optical Society of America,* version A, vol. 12, No. 5, May 1995 (hereinafter the "Moharam II Article").

M.G. Moharam & T. K. Gaylord, "Diffraction Analysis of Dielectric Surface–Relief Gratings", *Journal of the Optical Society of America,* vol. 72, No. 10, Oct. 1982, pp. 1385–1392 (hereinafter the "Moharam III Article").

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 15 is cancelled.

Claims 1, 27 and 28 are determined to be patentable as amended.

Claims 2–14 and 16–26, dependent on an amended claim, are determined to be patentable.

New claims 29–42 are added and determined to be patentable.

1. A method of determining a profile, comprising the steps of:
   (a) providing a substrate having a repeating structure comprising a plurality of lines, said lines having substantially identical profiles;
   (b) illuminating said repeating structure with radiation wherein said radiation [diacts] *diffracts*, said diffracted radiation having an intensity *as a function of wavelength*;
   (c) measuring said intensity *as a function of wavelength*;
   (d) providing a model structure on a data processing machine, said model structure comprising a repeating structure on said substrate, said model structure comprising a model profile, wherein said model profile comprises an edge having more than one X position;
   (e) mathematically predicting a predicted diffracted radiation intensity *for a plurality of wavelengths* when said model structure is illuminated with said radiation; and
   (f) comparing said predicted intensity with said measured intensity.

27. A method of determining the profile of a repeating structure comprising the steps of:
   (a) providing a substrate having a plurality of lines having substantially identical line profiles and spacings;
   (b) illuminating said lines with radiation having a range of wavelengths, wherein said radiation reflects with an intensity as a function of wavelength;
   (c) *selecting a polarization state of said reflected radiation;*
   [(c)] (*d*) measuring the intensity of radiation reflected from said lines as a function of wavelength;
   [(d)] (*e*) providing a model of the line profile and line spacing, wherein said model of the line profile comprises an edge having more than one X position;
   [(e)] (*f*) mathematically predicting the intensity of radiation that would be reflected from the model as a function of wavelength; and
   [(f)] (*g*) comparing the predicted intensity with the measured intensity; and

[(g)] (*e*) adjusting the model and repeating steps [(e) and] (f) *and* (*g*) to improve agreement in said comprising step [(f)] (*g*).

28. An apparatus for determining the profile of a line on a substrate, the apparatus comprising:
   a radiation source for illuminating the substrate with radiation, said substrate comprising a repeating structure, said repeating structure comprising a plurality of lines and spaces between said lines, said lines having substantially the same line profile, said spaces being substantially identical, the illuminating of the repeating structure for obtaining diffraction of said radiation, wherein said diffracted radiation has an intensity *as a function of wavelength*;
   a polarizer for selecting a single polarization *state* of [light of incident or] diffracted light;
   a detector for measuring said intensity *as a function of wavelength*;
   a data processing maching comprising a computer model structure, said model structure comprising a model repeating structure on a model substrate, said repeating structure comprising a plurality of model lines and model spaces between said model lines, said model lines having substantially the same model line profile, each said model line comprising an edge having more than one X position, said model spaces being substantially identical, said data processing machine for mathematically predicting a predicted diffracted radiation intensity when said model structure is illuminated with said radiation source;
   said data processing machine further comprising means for comparing said predicted intensity with said measured intensity; and
   said data processing machine further comprising means for adjusting said model structure and for repeating said predicting and comparing steps to improve agreement in said comparing step.

29. *The method of claim 1, wherein the repeating structure has a pitch that has a value and the radiation has a range of wavelengths, the value of the pitch being outside the range of wavelengths.*

30. *The method of claim 1, wherein said repeating structure is illuminated with radiation through an objective lens and said radiation diffracts into a plurality of orders including a zeroth order that has an intensity that varies as a function of wavelength; the method further comprising collecting the zeroth order through the objective lens, wherein the intensity of the zeroth order is measured as a function of wavelength.*

31. *The method of claim 1, wherein mathematically predicting a predicted diffracted radiation intensity comprises predicting a predicted diffracted radiation intensity for a plurality of wavelengths when said model structure is illuminated with radiation having a fixed angle of incidence.*

32. *The method of claim 31, providing multiple model structures on the data processing machine, each model structure comprising a different model profile, and for each model structure mathematically predicting a predicted diffracted radiation intensity for a plurality of wavelengths in the zeroth order when said model structure is illuminated with broadband radiation having a fixed angle of incidence, and comparing the measured intensity to the predicted intensity for each of the multiple models.*

33. *The method of claim 32, wherein each of the multiple model structures is stored in a library.*

34. *The method of claim 31, wherein the fixed angle of incidence is normal.*

35. The method of claim 1, further comprising selecting a polarization state of the diffracted radiation before measuring the intensity as a function of wavelength and wherein the predicted diffraction radiation intensity for a plurality of wavelengths is at the selected polarization state.

36. A method of determining a profile, comprising the steps of:

(a) providing a substrate having a repeating structure comprising a plurality of lines, said lines having substantially identical profiles;

(b) illuminating said repeating structure with broadband radiation along an optical axis that has a single angle of incidence with respect to the substrate, wherein said radiation diffracts into a plurality of orders including a zeroth order, said zeroth order of the diffracted radiation having an intensity that varies as a function of wavelength;

(c) measuring said intensity of the zeroth order for a plurality of wavelengths;

(d) providing a model structure on a data processing machine, said model structure comprising a repeating structure on said substrate, said model structure comprising a model profile, wherein said model profile comprises an edge having more than one X position;

(e) mathematically predicting a predicted diffracted radiation intensity for a plurality of wavelengths in the zeroth order when said model structure is illuminated with broadband radiation along an optical axis with the single angle of incidence; and (f) comparing said predicted diffracted radiation intensity with said measured intensity to determine the profile.

37. The method of claim 36, further comprising providing multiple model structures on the data processing machine, each model structure comprising a different model profile, and for each model structure mathematically predicting a predicted diffracted radiation intensity for a plurality of wavelengths in the zeroth order when said model structure is illuminated with broadband radiation along an optical axis with the single angle of incidence, and comparing the measured intensity to the predicted intensity for each of the multiple model structures to determine the profile.

38. The method of claim 36, wherein each of the multiple model structures is stored in a library.

39. The method of claim 36, wherein the broadband radiation comprises wavelengths from about 450 nm to about 750 nm.

40. The method of claim 36, wherein the single angle of incidence is normal.

41. The method of claim 36, wherein said repeating structure is illuminated with broadband radiation through a lens having a numerical aperture of less than about 1.

42. The method of claim 36, further comprising selecting a polarization state of the zeroth order before measuring said intensity of the zeroth order and predicting a predicted intensity for the plurality of wavelengths in the zeroth order is at the selected polarization state.

* * * * *